(12) United States Patent
Onishi et al.

(10) Patent No.: US 8,018,730 B2
(45) Date of Patent: Sep. 13, 2011

(54) POWER CONVERTER APPARATUS

(75) Inventors: Hiroyuki Onishi, Aichi-Ken (JP); Toshiaki Nagase, Aichi-ken (JP); Jun Ishikawa, Kariya (JP); Kazuyoshi Kontani, Kariya (JP); Toshinari Fukatsu, Kariya (JP); Hiroyuki Kobayashi, Kariya (JP); Naohito Kanie, Kariya (JP); Takahiro Nakamura, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 322 days.

(21) Appl. No.: 12/397,151

(22) Filed: Mar. 3, 2009

(65) Prior Publication Data

US 2009/0237904 A1  Sep. 24, 2009

(30) Foreign Application Priority Data

Mar. 4, 2008 (JP) ................. 2008-054049
May 16, 2008 (JP) ................. 2008-129483
May 20, 2008 (JP) ................. 2008-132267

(51) Int. Cl.
*H05K 1/18* (2006.01)
(52) U.S. Cl. ........ 361/763; 361/782; 361/624; 361/637; 361/611
(58) Field of Classification Search .............. 361/760, 361/781–783, 773, 774, 278, 299, 298, 306.1, 361/622, 624, 632, 637, 639, 648, 750, 200
See application file for complete search history.

(56) References Cited

U.S. PATENT DOCUMENTS

| | | | |
|---|---|---|---|
| 6,493,249 B2 | 12/2002 | Shirakawa et al. | |
| 6,898,072 B2 * | 5/2005 | Beihoff et al. | 361/676 |
| 2006/0232942 A1 * | 10/2006 | Nakatsu et al. | 361/710 |
| 2006/0255448 A1 | 11/2006 | Nagase et al. | |
| 2007/0051974 A1 * | 3/2007 | Azuma et al. | 257/177 |
| 2007/0109715 A1 | 5/2007 | Azuma et al. | |
| 2007/0279864 A1 * | 12/2007 | Hirota et al. | 361/697 |
| 2010/0155158 A1 | 6/2010 | Azuma et al. | |

FOREIGN PATENT DOCUMENTS

| | | |
|---|---|---|
| EP | 1703554 A2 | 9/2006 |
| JP | 11-163257 A | 6/1999 |
| JP | 2000-060126 | 2/2000 |
| JP | 2002-044964 | 2/2002 |
| JP | 2004-214452 A | 7/2004 |
| JP | 2005-261035 | 9/2005 |
| JP | 2005-347561 A | 12/2005 |
| JP | 2006-253516 A | 9/2006 |
| JP | 2006-318953 A | 11/2006 |
| JP | 2007-143272 | 6/2007 |

* cited by examiner

*Primary Examiner* — Yuriy Semenenko
*Assistant Examiner* — Andargie M Aychillhum
(74) *Attorney, Agent, or Firm* — Woodcock Washburn LLP

(57) ABSTRACT

A power converter apparatus includes a substrate 22 on which switching elements Q, Q1 to Q6 are mounted, positive and negative terminal interconnection members 27, 28 mounted on the substrate, and a capacitor 17 having a positive terminal 17a connected to the main body of the positive terminal interconnection member 27 and a negative terminal 17b connected to the main body of the negative terminal interconnection member 28. The interconnection members each have a plate-like main body 27a, 28a that is located above and parallel to the substrate 22. The main bodies of the interconnection members are stacked to be close to each other while being electrically insulated from each other. Each of the positive terminal interconnection member and the negative terminal interconnection member further includes a plate-like extension 27b, 28b that extends from the corresponding main body toward the substrate, and a terminal portion 27c, 28c that extends from the extension and is joined to the substrate. The extensions extend to positions closest to the substrate, while being parallel to and close to each other.

11 Claims, 16 Drawing Sheets

POWER CONVERTER APPARATUS

CROSS REFERENCE TO RELATED APPLICATIONS

This application claims priority to Japanese Patent Application No. 2008-132267 filed May 20, 2008 which claims priority to Japanese Patent Application No. 2008-129483, filed May 16, 2008, which claims priority to Japanese Patent Application No. 2008-054049, filed Mar. 4, 2008.

BACKGROUND

The present invention relates to a power converter apparatus.

Japanese Laid-Open Patent Publication No. 2005-347561 discloses a structure of a power converter apparatus having switching elements and capacitors, in which a portion of the capacitor interconnection member that corresponds to an external connection terminal is configured to reduce parasitic inductance of the interconnection. Specifically, as shown in FIGS. 17A and 17B, six insulated substrates 101 are provided on the upper surface of a base 100, and a collector pattern 102 and an emitter pattern 103 are formed on each insulated substrate 101. A switching chip 104 and a diode chip 105 are mounted on the collector pattern 102, and the switching chip 104 and the diode chip 105 are connected to the emitter pattern 103 by bonding wires 106. A P-type conductor 107 includes a plate-like main conductor 107a and three connecting conductors 107b projecting downward from the main conductor 107a. The P-type conductor 107 is connected to the insulated substrates 101 at the connecting conductors 107b. Likewise, an N-type conductor 108 includes a plate-like main conductor 108a and three connecting conductors 108b projecting downward from the main conductor 108a. The N-type conductor 108 is connected to the insulated substrates 101 at the connecting conductors 108b. The main conductors 107a, 108a are laminated together, while being insulated from each other. Belt-like sub-conductors 107c, 108c are provided at ends of the main conductors 107a, 108a, respectively. The sub-conductors 107c, 108c are laminated together, while being insulated from each other. The ends of the sub-conductors 107c, 108c form external connecting terminals P10, N10, respectively.

However, to reduce the parasitic inductance in the interconnection of the capacitor, it is not sufficient to provide an improved structure of the external connecting terminals P10, N1 in the capacitor interconnection member. Specifically, parasitic inductance in the interconnection needs to be reduced.

SUMMARY

Accordingly, it is an objective of the present invention to provide a power converter apparatus that further reduces parasitic inductance of capacitor interconnection.

To achieve the foregoing objective and in accordance with one aspect of the present invention, a power converter apparatus including a substrate, a positive terminal interconnection member, a negative terminal interconnection member, and a capacitor is provided. Switching elements are mounted on the substrate. The positive terminal interconnection member and a negative terminal interconnection member are placed on the substrate. The interconnection members each have a plate-like main body that is located above and parallel to the substrate. The main bodies of the interconnection members are stacked to be close to each other while being electrically insulated from each other. The capacitor has a positive terminal connected to the main body of the positive terminal interconnection member and a negative terminal connected to the main body of the negative terminal interconnection member. Each of the positive terminal interconnection member and the negative terminal interconnection member further includes a plate-like extension that extends from the corresponding main body toward the substrate, and a terminal portion that extends from the extension and is joined to the substrate. The extensions extending to positions closest to the substrate while being parallel to and close to each other.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF ILLUSTRATIVE EMBODIMENTS

A three-phase inverter apparatus 11 according to a first embodiment of the present invention will now be described with reference to FIGS. 1A to 9.

Figure 1A:
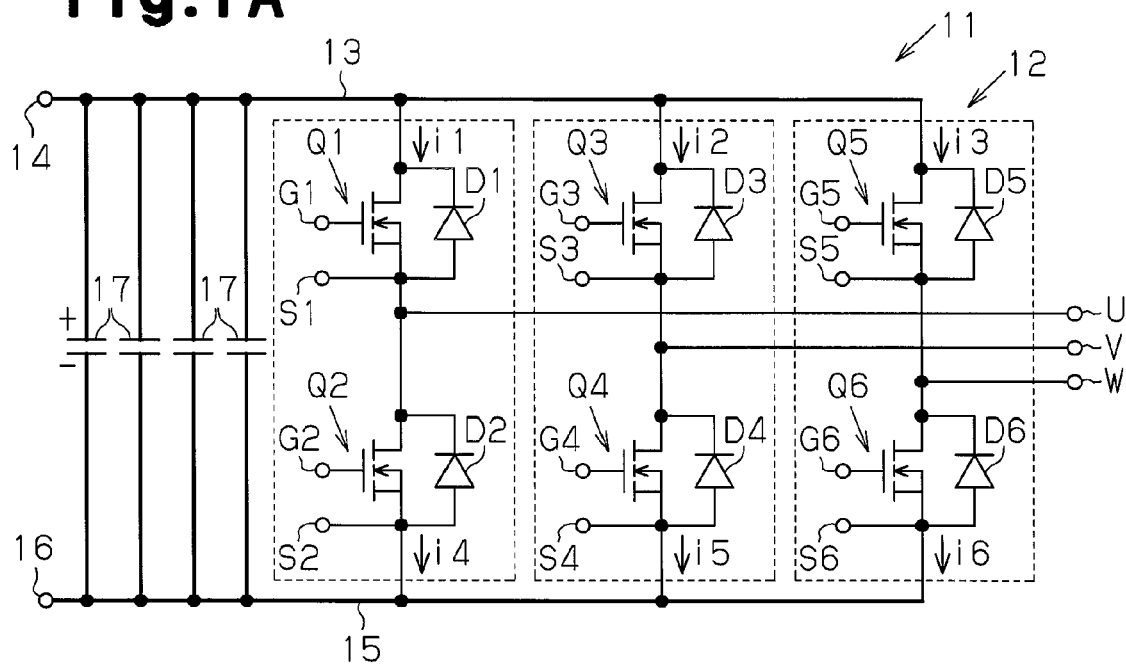
FIG. 1A is a circuit diagram showing an inverter apparatus, which is a power converter apparatus according to a first embodiment of the present invention.

First, the circuit configuration of the inverter apparatus will be described. As shown in FIG. 1A, the inverter apparatus 11 has an inverter circuit 12 with six switching elements Q1 to Q6. MOSFETs (metal-oxide-semiconductor field-effect transistors) are used as the switching elements Q1 to Q6. In each of the pair of the first and second switching elements Q1, Q2, the pair of the third and fourth switching elements Q3, Q4, and the pair of the fifth and sixth switching elements Q5, Q6, the switching elements are connected in series. Diodes D1 to D6 are connected in inverse parallel with a part between the drain and the source of the switching elements Q1 to Q6, respectively. Each of the switching elements Q1, Q3, Q5 and the corresponding one of the diodes D1, D3, D5 connected thereto form a structure that is referred to as an upper arm. Also, each of the switching elements Q2, Q4, Q6 and the corresponding one of the diode D2, D4, D6 connected thereto form a structure that is referred to as a lower arm.

The drains of the switching elements Q1, Q3, Q5 are connected to a positive input terminal 14 for inputting power through a line 13, and the sources of the switching elements Q2, Q4, Q6 are connected to a negative input terminal 16 for inputting power through a line 15. A plurality of capacitors 17 are connected in parallel between the line 13 and the line 15. In the present embodiment, electrolytic capacitors are used as the capacitors 17. The positive terminals and the negative terminals of the capacitors 17 are connected to the line 13 and the line 15, respectively.

The node between the switching elements Q1, Q2 is connected to a U-phase terminal U, the node between the switching elements Q3, Q4 is connected to a V-phase terminal V, and the node between the switching elements Q5, Q6 is connected to a W-phase terminal W. The gates of the switching elements Q1 to Q6 are connected to drive signal input terminals G1 to G6, respectively. The sources of the switching elements Q1 to Q6 are connected to signal terminals S1 to S6, respectively.

Figure 1B:
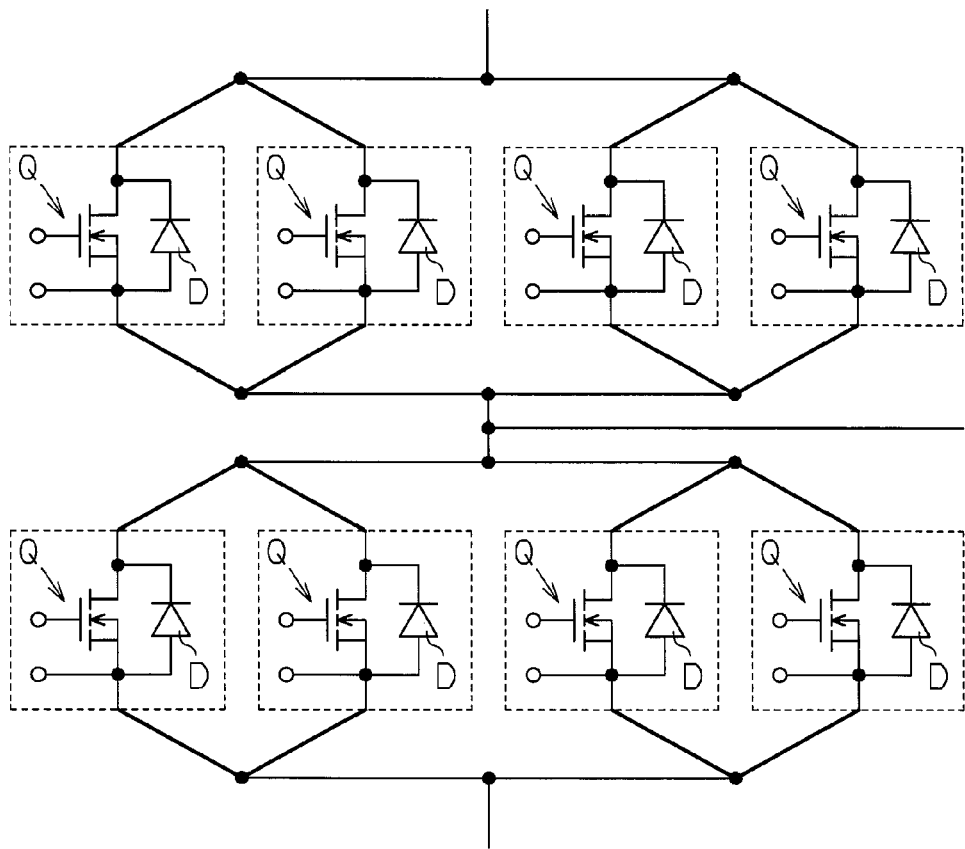
FIG. 1B is a circuit diagram showing a modification of the arms of the inverter apparatus shown in FIG. 1A.

In FIG. 1A, each of the upper arms and the lower arms includes one switching element and one diode. However, in a case where the amount of current through each arm is great, each arm may be configured with a plurality of parallel connected pairs of switching elements Q and diodes D as shown in FIG. 1B. In the present embodiment, each arm is formed by four pairs of a switching element Q and a diode D.

The structure of the inverter apparatus 11 will now be described.

Figure 2:
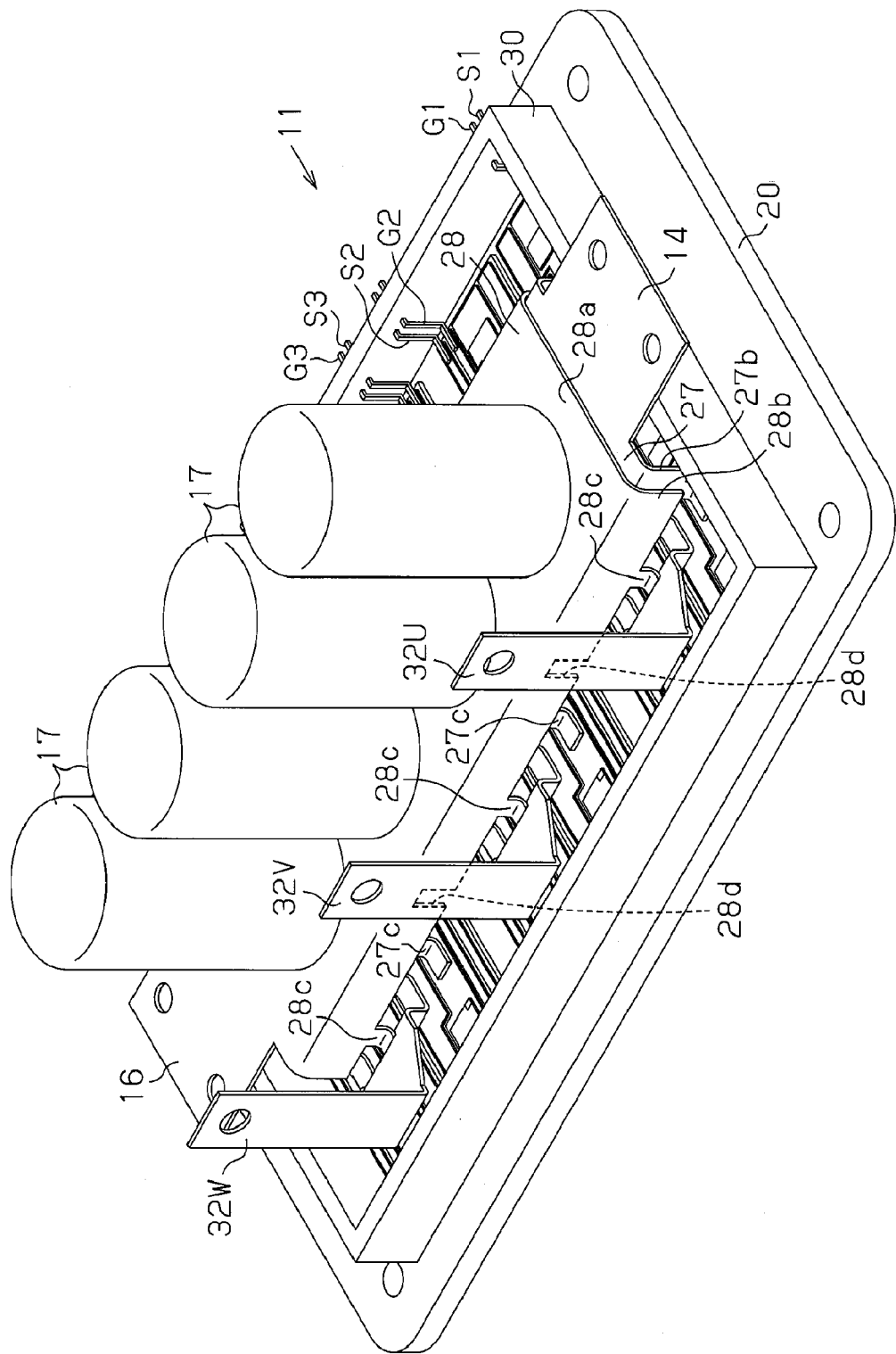
FIG. 2 is a schematic perspective view showing the inverter apparatus of FIG. 1A, from which the cover is omitted.
Figure 3:
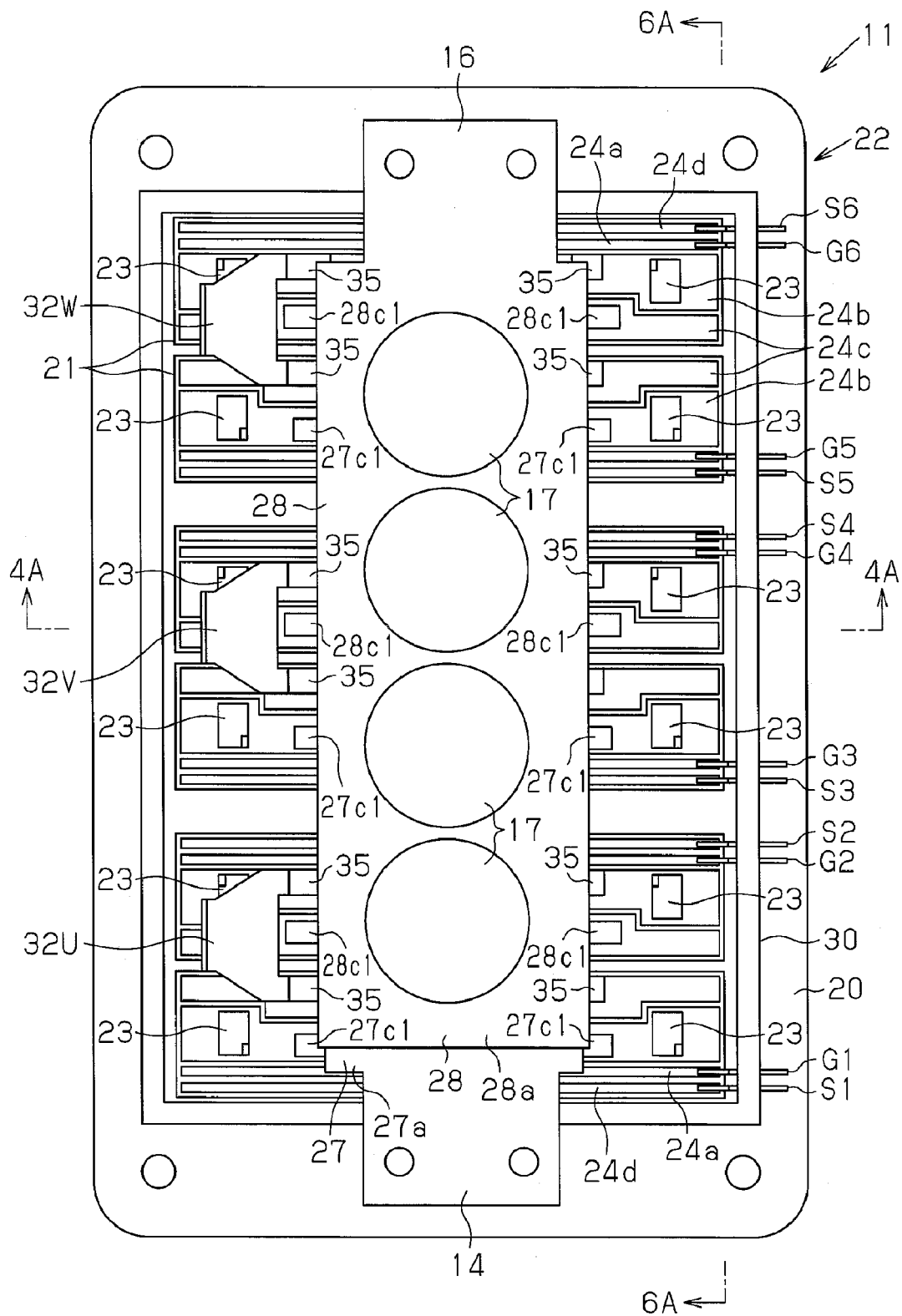
FIG. 3 is a plan view showing the inverter apparatus of FIG. 2.

As shown in FIGS. 2 and 3, the inverter apparatus 11 includes a substrate 22 formed by a metal base 20 made of copper and a plurality of ceramic substrates 21, which are insulated substrates. Semiconductor chips 23 are mounted on the substrate 22. Each semiconductor chip 23 incorporates one switching element (MOSFET) and one diode, which form a single device. That is, each semiconductor chip 23 corresponds to one of the devices provided with a single switching element Q and a single diode D shown in FIG. 1B.

Each ceramic substrate 21 has a ceramic plate 26, which is formed of, for example, aluminum nitride, alumina, or silicon nitride. As shown in FIG. 5, circuit patterns 24a, 24b, 24c, 24d are formed on the upper surface of the ceramic plate 26. As shown in FIG. 4B, a metal plate 25 is provided on the lower surface of the ceramic plate 26. The circuit patterns 24a, 24b, 24c, 24d and the metal plate 25 are made of, for example, aluminum or copper. The metal plate 25 functions as a joining layer that joins the ceramic substrates 21 and the metal base 20 with each other. The ceramic substrates 21 are joined to the metal base 20 with the metal plates 25 in between using solder (not shown). Hereinafter, the metal base 20 is referred to a bottom portion (lower portion) of the inverter apparatus 11.

As shown in FIG. 5, the circuit patterns 24a, 24b, 24c, and 24d are circuit patterns for gate signals, drains, sources, and source signals, respectively. Each of the circuit patterns 24a to 24d is formed like a belt. The drain circuit pattern 24b and the source circuit pattern 24c are adjacent to and parallel with each other. The gate signal circuit pattern 24a and the source signal circuit pattern 24d are located opposite to the circuit pattern 24c and parallel with the circuit pattern 24b. The semiconductor chips 23 are joined to the drain circuit pattern 24b with solder. The gates of the semiconductor chips 23 and the gate signal circuit pattern 24a are electrically connected to each other by wire bonding. The sources of the semiconductor chips 23 are electrically connected to the source circuit patterns 24c and the source signal circuit patterns 24d by wire bonding.

Figure 7A:
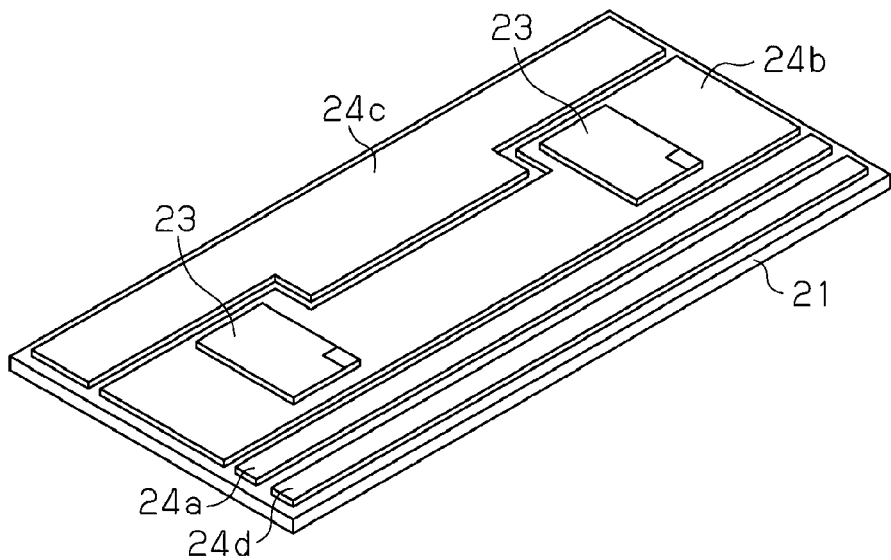
FIG. 7A is a schematic perspective view illustrating a ceramic substrate on which chip parts in the inverter apparatus of FIG. 1A are mounted.
Figure 7B:
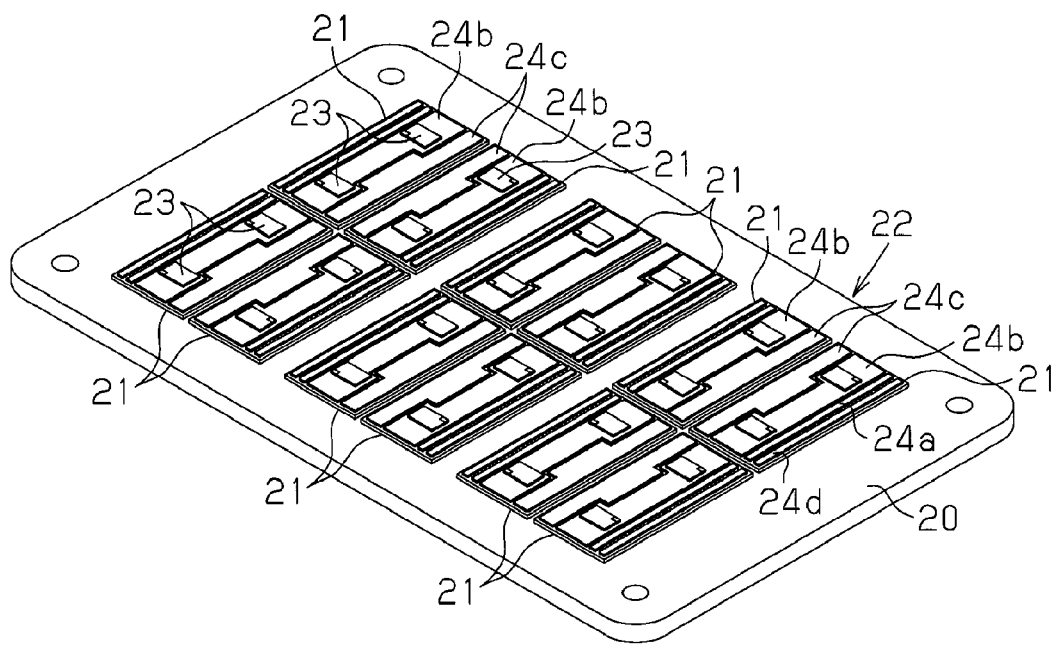
FIG. 7B is a schematic perspective view illustrating a metal base on which the ceramic substrate of FIG. 7A is mounted.

As shown in FIG. 7B, the metal base 20 is substantially rectangular. Twelve ceramic substrates 21 are provided on the metal base 20 and are arranged in six rows and two columns, such that the longitudinal direction of the ceramic substrates 21 is perpendicular to the longitudinal direction of the metal base 20. The semiconductor chips 23 on two ceramic substrates 21 on each row form an arm of the inverter circuit 12. In the present embodiment, two semiconductor chips 23 are mounted on each ceramic substrate 21, and the four semiconductor chips 23 on the two ceramic substrate 21 in each row form one arm. As shown in FIG. 5, the two semiconductor chips 23 on each ceramic substrate 21 are arranged at ends in the longitudinal direction of the circuit pattern 24b, so that a space exists between the semiconductor chips 23.

As shown in FIGS. 3 to 4B, a plate-like positive interconnection member 27 and a plate-like negative interconnection member 28 are located on the substrate 22 in a stacked state. In the present embodiment, the negative interconnection member 28 is located over the positive interconnection member 27. The positive interconnection member 27 and the negative interconnection member 28 form the line 13 and the line 15 shown in FIG. 1A, respectively.

Figure 4A:
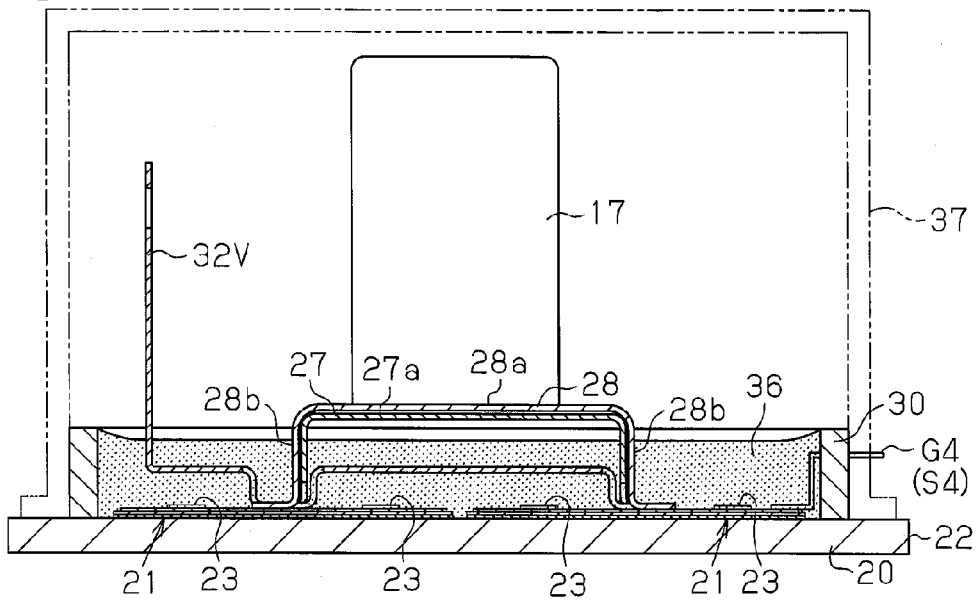
FIG. 4A is a cross-sectional view taken along line 4A-4A in FIG. 3.
Figure 4B:
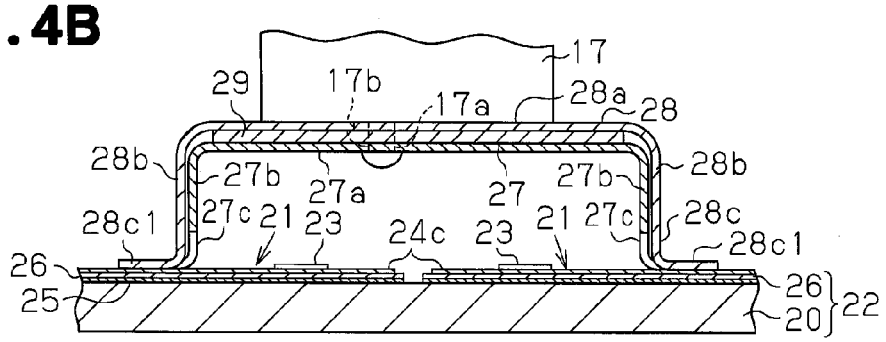
FIG. 4B is a partially enlarged view of FIG. 4A, from which a part is omitted.
Figure 5:
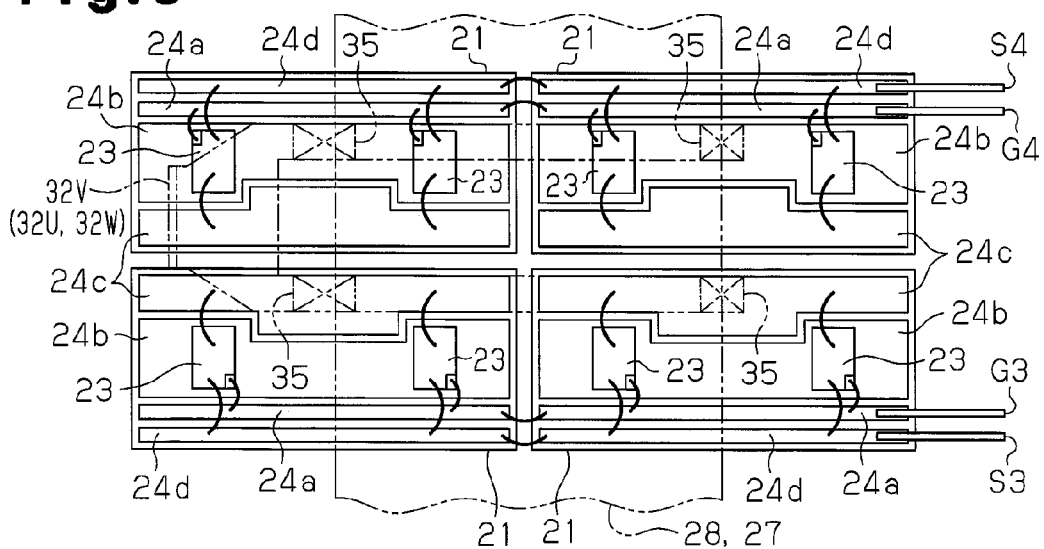
FIG. 5 is a partial plan view showing the connection state on the substrate of the inverter apparatus of FIG. 1A.

As show in FIGS. 4A and 4B, the positive interconnection member 27 and the negative interconnection member 28 include plate-like rectangular main bodies 27a, 28a and a pair of downward extensions 27b, 28b serving as extensions, respectively. The main bodies 27a, 28a are located above the substrate 22 to be parallel with the substrate 22, and are arranged close to each other while being insulated from each other. The pairs of the downward extensions 27b, 28b are located at ends of the corresponding main body 27a, 28a in the widthwise direction while being bent to extend toward the substrate 22. The downward extensions 27b, 28b in each pair are symmetry with respect to a line passing through the center of the corresponding one of the main bodies 27a, 28a in the widthwise direction. In each side of the main bodies 27a, 28a, the downward extension 27b and the downward extension 28b are stacked on each other. In this manner, in each side of the main bodies 27a, 28a, the downward extension 27b and the downward extension 28b extend from the main bodies 27a, 28a to the vicinity of the substrate 22 (the ceramic substrate 21) while being close to and parallel to each other.

The positive interconnection member 27 and the negative interconnection member 28 have a plurality of terminal portions 27c, 28c, respectively. The terminal portions 27c, 28c each extend downward from the lower ends of the downward extensions 27b, 28b, and then bent to extend parallel with the main bodies 27a, 28a (see FIG. 2). In the present embodiment, three pairs of the terminal portions 27c, 28c, or six terminal portions, are provided. As shown in FIG. 3, each terminal portion 27c has a joint portion 27c1 at the distal end. At the joint portion 27c1, the terminal portion 27c is joined by ultrasonic bonding to a center of the drain circuit pattern 24b on the ceramic substrate 21 having the semiconductor chip 23 forming an upper arm. Each terminal portion 28c also has a joint portion 28c1 at the distal end. At the joint portion 28c1, the terminal portion 28c is joined by ultrasonic bonding to a center of the source circuit pattern 24c on the ceramic substrate 21 having the semiconductor chip 23 forming a lower arm. The joint portions 27c1, 28c1, which are on the same side of the interconnection members 27, 28 in the widthwise direction, that is, joint portions between the terminal portions 27c, 28c and the circuit patterns 24b, 24c that are joined by ultrasonic bonding are located on a single straight line.

Figure 6A:
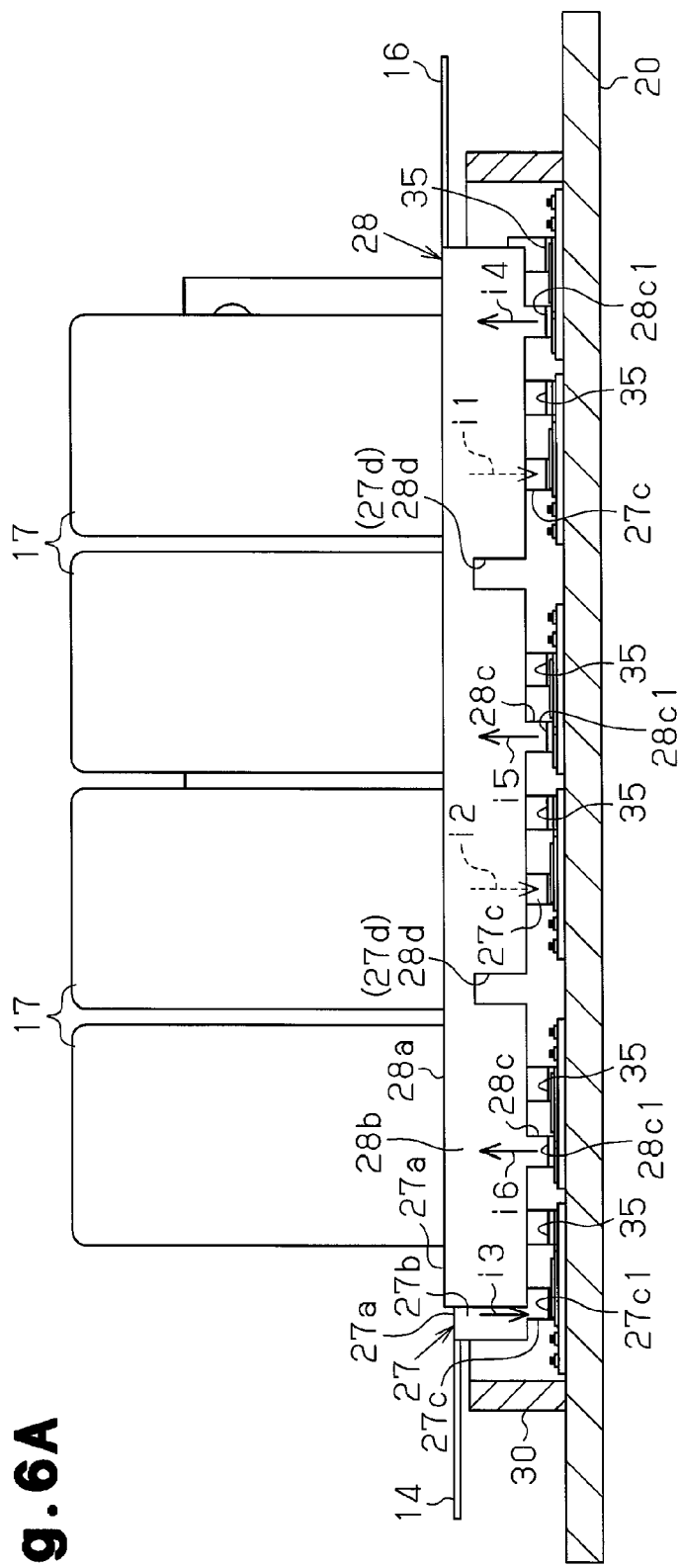
FIG. 6A is a cross-sectional view taken along line 6A-6A in FIG. 3.
Figure 6B:
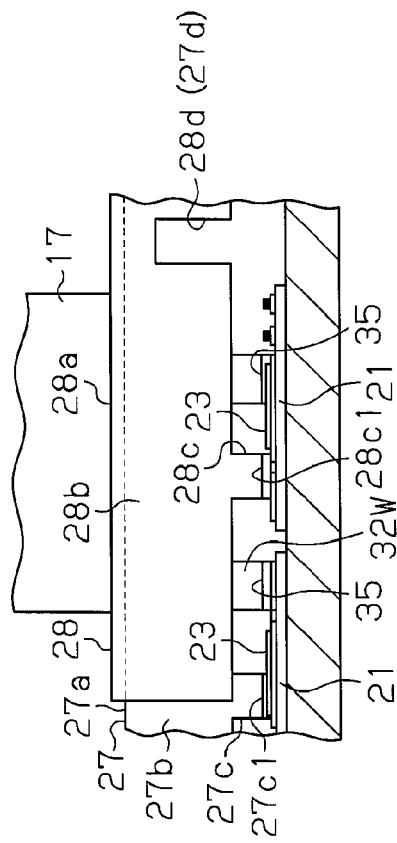
FIG. 6B is a partially enlarged view of FIG. 6A.

In FIGS. 6A and 6B, a plurality of notches 27d, 28d are formed in the downward extensions 27b, 28b, respectively. The notches 27d of the downward extension 27b face the notches 28d of the downward extension 28b. The notches 27d, 28d function to limit the flow of current. That is, the notches 27d, 28d are capable of limiting electric currents i1, i2, i3, which flow into the upper arms through the positive interconnection member 27 shown in FIGS. 1A and 6A, and electric current i4, i5, i6, which flow out of the lower arms through the negative interconnection member 28. The widths of the notches 27d, 28d are determined to be a value that does not hinder the passage of gel 36, which will be discussed below (see FIG. 4A).

On the other hand, as shown in FIG. 4B, an insulation sheet 29 is located between the main body 27a of the positive interconnection member 27 and the main body 28a of the negative interconnection member 28. The insulation sheet 29 functions as an insulation member that electrically insulates the main bodies 27a, 28a from each other. Examples of the insulation sheet 29 include a resin sheet. The main body 27a of the positive interconnection member 27, the main body 28a of the negative interconnection member 28, and the insulation sheet 29 have elongated holes into which a positive terminal 17a and a negative terminal 17b of a capacitor 17 can be inserted.

As shown in FIGS. 2 and 3, a support frame 30 made of electrical insulation material is fixed to the metal base 20 to extend along the edge of the metal base 20. All the ceramic substrates 21 are accommodated in the support frame 30. The positive input terminal 14 for receiving outer power is formed at a longitudinal end of the main body 27a of the positive interconnection member 27. The positive input terminal 14 extends outside of the support frame 30. The negative input terminal 16 is formed at a longitudinal end of the main body 28a of the negative interconnection member 28, specifically, the end opposite to the positive input terminal 14. The negative input terminal 16 extends outside of the support frame 30.

As shown in FIGS. 4A and 4B, the capacitors 17 are arranged on one of the main body 27a of the positive interconnection member 27 and the main body 28a of the negative interconnection member 28 that is farther from the substrate 22, that is, on the main body 28a of the negative interconnection member 28. In the present embodiment, four capacitors 17 are arranged on the main body 28a with electrical insulation member (not shown) in between, such that the positive terminals 17a and the negative terminals 17b face the substrate 22. The positive terminal 17a and the negative terminal 17b of each capacitor 17 are located on one side of the capacitor main body. The positive terminal 17a is connected to the main body 27a of the positive interconnection member 27, and the negative terminal 17b is connected to the main body 28a of the negative interconnection member 28.

As shown in FIGS. 2 and 3, three output electrode members 32U, 32V, 32W of the inverter apparatus 11 each have a portion that extends upward and a portion that extends laterally, so as to be shaped like L as viewed from the side. The upward extending portion is located close to the support frame 30, and the laterally extending portion extends perpendicular to the longitudinal direction of the positive interconnection member 27 below the main body 27a of the positive interconnection member 27. The insulation between the positive interconnection member 27 and the output electrode members 32U, 32V, 32W is ensured by the gel 36 (shown in FIG. 4A), which is, for example, silicone gel. The insulation between the downward extension 27b of the positive interconnection member 27 and the downward extension 28b of the negative interconnection member 28 is also ensured by the gel 36. The gel 36 is accommodated in the space encompassed by the support frame 30.

As shown in, for example, FIG. 3, the output electrode members 32U, 32V, 32W are each formed by pressing a copper plate the width of which is substantially equal to the width of the ceramic substrates 21. As shown in FIG. 5, each of the output electrode members 32U, 32V, 32W has four joint portions 35. Two of the joint portions 35 are joined to substantially centers of the circuit patterns 24c of the two ceramic substrate 21 having the semiconductor chips 23 that form the upper arm. The other two are joined to substantially centers of the circuit patterns 24b of the two ceramic substrate 21 having the semiconductor chips 23 that form the lower arm. More specifically, the output electrode member 32U is joined by ultrasonic bonding to the source circuit pattern 24c of the upper arm formed by the first switching element Q1 and the diode D1, and to the drain circuit pattern 24b of the lower arm formed by the second switching element Q2 and the diode D2. The output electrode member 32V is joined by ultrasonic bonding to the source circuit pattern 24c of the upper arm formed by the third switching element Q3 and the diode D3, and to the drain circuit pattern 24b of the lower arm formed by the fourth switching element Q4 and the diode D4. The output electrode member 32W is joined by ultrasonic bonding to the source circuit pattern 24c of the upper arm formed by the fifth switching element Q5 and the diode D5, and to the drain circuit pattern 24b of the lower arm formed by the sixth switching element Q6 and the diode D6.

Figure 8A:
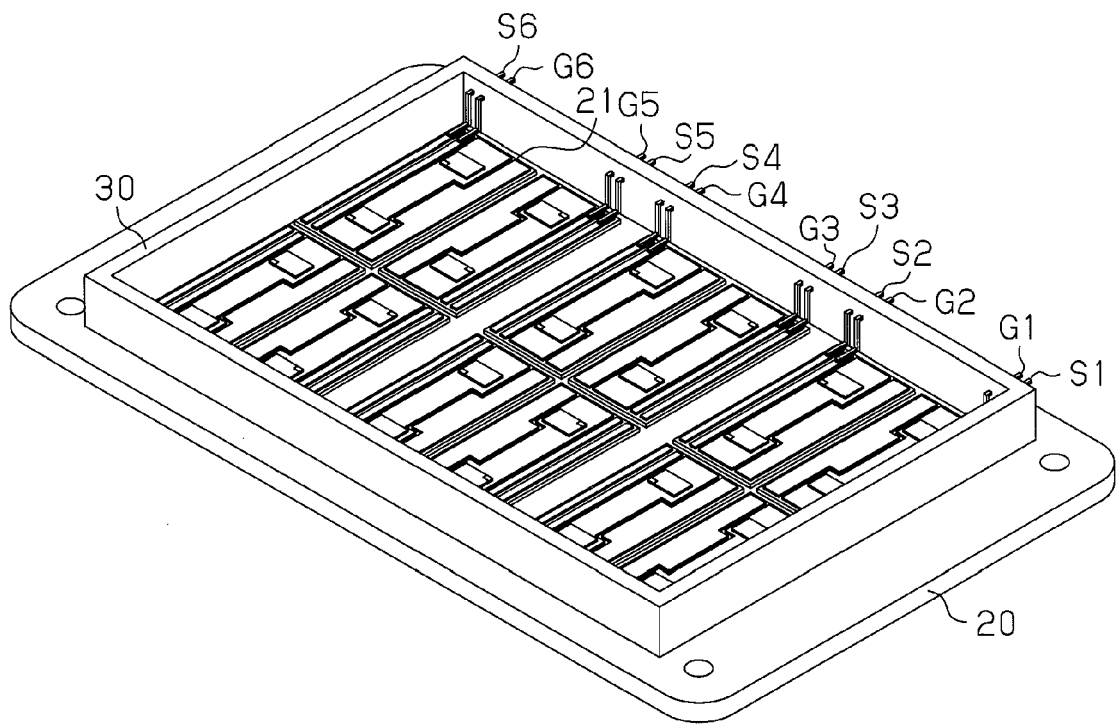
FIG. 8A is a schematic perspective view showing a state in which a support frame is attached to the metal base of FIG. 7B.
Figure 8B:
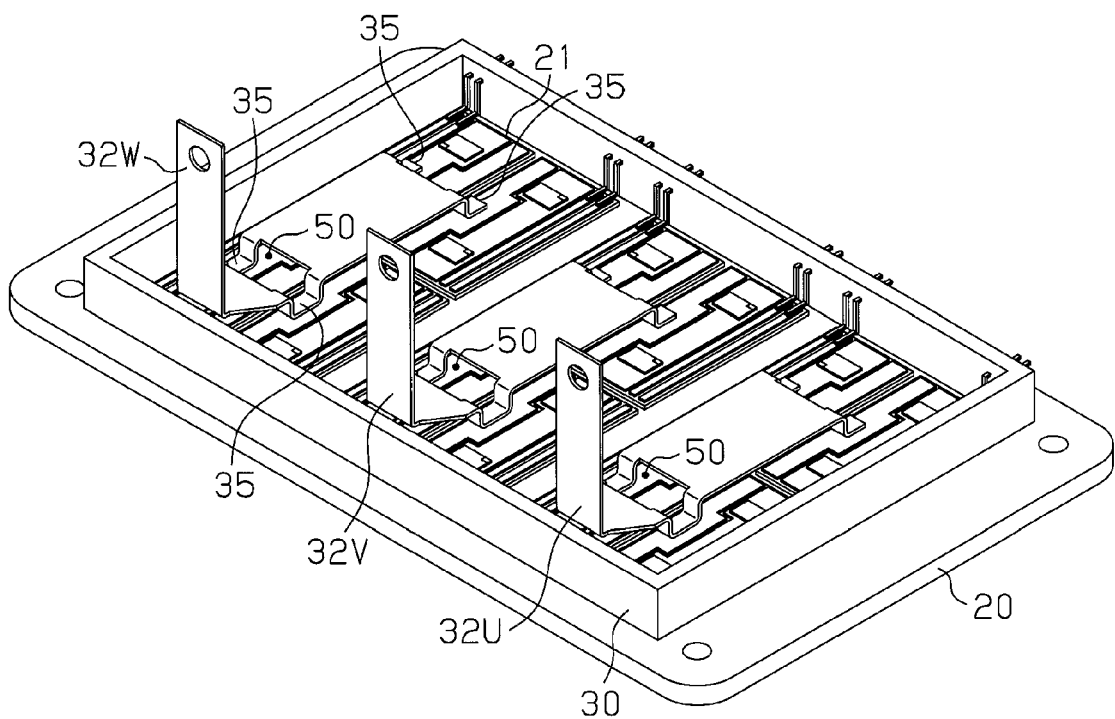
FIG. 8B is a schematic perspective view showing a state in which output electrode members are attached to the metal base of FIG. 8A.

As shown in FIG. 8B, each of the substantially L-shaped output electrode members 32U, 32V, 32W has a horizontal portion, which has a pair of the joint portions 35 at the proximal end (a part closer to the bent portion), and another pair of the joint portions 35 at the distal end. The joint portions 35 extend toward the substrate 22 from the horizontal portion. A space 50 capable of receiving the terminal portion 28c of the negative interconnection member 28 is defined between the joint portions 35 at the proximal side and between the joint portions 35 at the distal side. As shown in FIG. 3, a pair of the joint portions 35 and the joint portions 27c1, 28c1 are arranged on a single line at each of the widthwise sides of the interconnection members 27, 28.

As shown in FIGS. 3 and 5, of the two ceramic substrates 21 corresponding to each arm, the gate signal circuit patterns 24a and the source signal circuit patterns 24d of the ceramic substrate 21 located at the distal end of the horizontal portion of the output electrode members 32U, 32V, 32W are connected to the drive signal input terminals G1 to G6 and the signal terminals S1 to S6, respectively. The terminals G1 to G6 and S1 to S6 are integrally molded with the support frame 30 so as to extend through the support frame 30, so that second ends project from the support frame 30. In FIG. 5, the circuit patterns 24a formed on the two ceramic substrates 21 of each arm are electrically connected to each other by wire bonding. Also, the circuit patterns 24d formed on the two ceramic substrates 21 of each arm are electrically connected to each other by wire bonding.

As shown in FIG. 4A, the support frame 30 is filled with the gel 36, which is then cured to insulate and protect the semiconductor chips 23. A cover 37 may be fixed to the metal base 20 with bolts to cover the surface of the substrate 22 on which the semiconductor chips 23, or the switching elements Q1 to Q6 are mounted, the positive interconnection member 27, the negative interconnection member 28, the capacitors 17, the output electrode members 32U, 32V, 32W, the support frame 30.

A method for manufacturing the inverter apparatus 11, which is constructed as above, will hereafter be described.

First, a step for mounting the semiconductor chips 23 on the ceramic substrates 21 will be described. In this step, as shown in FIG. 7A, two semiconductor chips 23 are joined by soldering to the drain circuit pattern 24b on a ceramic substrate 21 such that a space exists in a center in the longitudinal direction. As shown in FIG. 5, the gate of each semiconductor chip 23 and the gate signal circuit pattern 24a are connected to each other by wire bonding, the source of each semiconductor chip 23 and the source circuit pattern 24c are connected to each other by wire bonding, and the source of each semiconductor chip 23 and the source signal circuit pattern 24d are connected to each other by wire bonding.

Next, a step for joining ceramic substrate 21 to the metal base 20 will be described. In this step, as shown in FIG. 7B, the ceramic substrates 21 on which the semiconductor chips 23 are mounted are joined by soldering to the metal base 20 in six rows and two columns. As shown in FIG. 5, the circuit pattern 24a and the circuit pattern 24d of each ceramic substrates 21 having the arms are electrically connected to the circuit pattern 24a and the circuit pattern 24d of another ceramic substrate 21 having the arms, respectively.

Next, a step for joining output electrode members 32U, 32V, 32W to the ceramic substrates 21 will be described. In this step, as shown in FIG. 8A, a support frame 30 having drive signal input terminals G1 to G6 and signal terminals S1 to S6 is fixed to the metal base 20 so as to encompass the ceramic substrates 21. The support frame 30 is fixed by means of adhesive or screws. Then, as shown in FIG. 8B, the output electrode members 32U, 32V, 32W are arranged such that each joint portion 35 contacts a substantially center of one of the drain circuit pattern 24b and the source circuit pattern 24c (see FIG. 5). Subsequently, the joint portions 35 are successively joined by ultrasonic bonding to the circuit patterns 24b and the circuit patterns 24c. Also, the first ends of the drive signal input terminals G1 to G6 are joined to the circuit patterns 24a by ultrasonic bonding, and the first ends of the signal terminals S1 to S6 are joined to the circuit patterns 24d by ultrasonic bonding.

Figure 9:
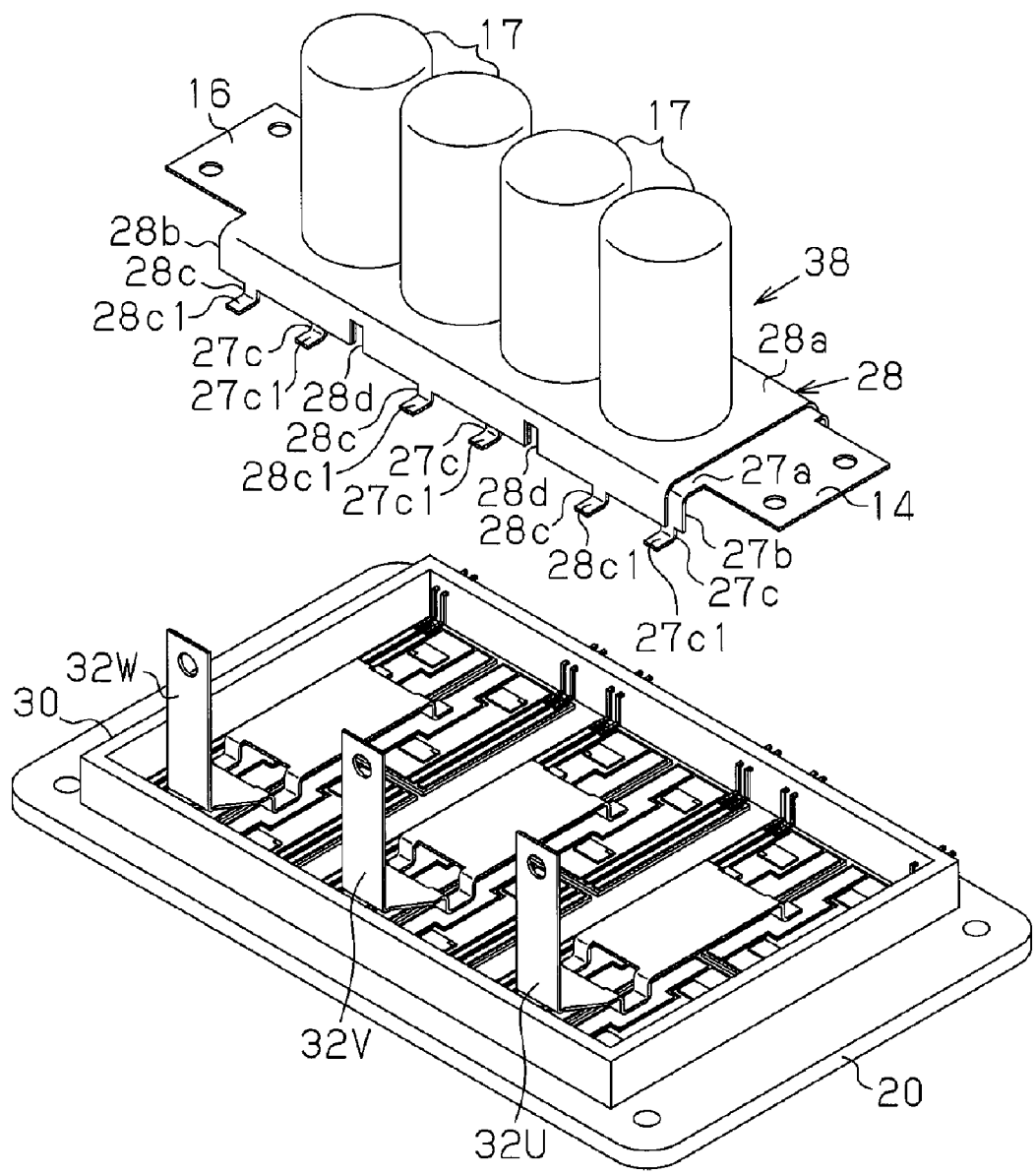
FIG. 9 is a schematic perspective view showing the relationship among the capacitor assembly, the metal base, the support frame, and the output electrode members in the inverter apparatus of FIG. 1A.

Then, a step for assembling a capacitor assembly 38 shown in FIG. 9 is performed. In this step, four capacitors 17 are fixed along a single line at predetermined intervals using a jig, such that the positive terminals 17a and the negative terminals 17b face upward. Then, a negative interconnection member 28 is fixed to the negative terminals 17b of the capacitors 17 with insulating material in between. Subsequently, a positive interconnection member 27 is fixed to the positive terminals 17a of the capacitors 17 while placing an insulation sheet 29 between the positive interconnection member 27 and the main body 28a of the negative interconnection member 28. In this manner, the capacitor assembly 38 is assembled such that the main body 27a of the positive interconnection member 27 and the main body 28a of the negative interconnection member 28 are insulated from each other, and that the positive interconnection member 27 and the negative interconnection member 28 are electrically connected to the positive terminals 17a and the negative terminals 17b of the capacitors 17, respectively.

Next, a step for joining by ultrasonic bonding the capacitor assembly 38 to the ceramic substrates 21 will be described. In this step, the capacitor assembly 38 is first placed on the ceramic substrates 21. As shown in FIG. 9, the capacitor assembly 38 is arranged at a predetermined position in the support frame 30 from above the ceramic substrates 21. At this time, as shown in FIG. 3, the joint portions 27c1, 28c1 on the same side of the interconnection members 27, 28 in the widthwise direction are located on a single line.

Thereafter, the terminal portions 27c, 28c are successively joined to the circuit patterns 24b, 24c at the joint portions 27c1, 28c1 by ultrasonic bonding. The joint portions 27c1, 28c1 are close to the capacitors 17. Thus, if general capacitors in which the heat resistance is not particularly considered are used as the capacitors 17, and soldering is used to join the terminal portions 27c, 28c, the heat accompanying the soldering can adversely affect the capacitors 17. However, since the terminal portions 27c, 28c and the circuit patterns 24b, 24c are joined by ultrasonic bonding, the amount of heat applied to the capacitors 17 is less than the case where soldering is performed. Thus, special capacitors with enhanced heat resistance are not required.

As shown in FIG. 4, to electrically insulate and protect portions that should be kept away from moisture and oxidation, for example, the semiconductor chips 23 and joint portions, the support frame 30 is filled with gel 36, which is then cured. As shown in FIGS. 6A and 6B, the downward extensions 27b, 28b of the positive interconnection member 27 and the negative interconnection member 28 have notches 27d, 28d, respectively. Compared to the case where no notches 27d, 28d are provided, the gel 36 easily flows into the space between the positive interconnection member 27 and the negative interconnection member 28. Consequently, the cover 37 is fixed to the metal base 20 with bolts, so that the inverter apparatus 11 is completed as shown in FIG. 4A.

Functions of the inverter apparatus 11 having the above construction will now be described.

The inverter apparatus 11 is, for example, a part of the power supply unit of a vehicle. In the inverter apparatus 11 shown in FIG. 1A, the positive input terminal 14 and the negative input terminal 16 are connected to a DC power source (not shown), and the U-phase terminal U, the V-phase terminal V, and the W-phase terminal W are connected to a motor (not shown). The drive signal input terminals G1 to G6 and the signal terminals S1 to S6 are connected to a control unit (not shown).

The switching elements Q1, Q3, Q5 of the upper arm and the switching elements Q2, Q4, Q6 of the lower arm are each subjected to ON-OFF control at predetermined intervals, so that the motor is driven on AC.

In FIG. 2, at switching of the switching elements Q1 to Q6, a current that abruptly rises or a current that abruptly falls flows through the positive interconnection member 27 and the negative interconnection member 28. The flowing directions of the current in the positive interconnection member 27 and the negative interconnection member 28 are opposite to each other. Since the flat plate-like main body 27a, 28a are parallel to and close to each other, the inductance of the interconnection is reduced by the effect of mutual inductance. The downward extensions 27b, 28b are also parallel to and close to each other, and the directions of the flows of current are opposite to each other. This further reduces the inductance of the interconnection.

In this manner, the inductance of the line from the capacitors 17 to a position closest to the semiconductor chips 23 is reduced, and the surge voltage generated when the switching of the switching elements Q1 to Q6 is suppressed. Therefore, the semiconductor chips 23 are prevented from being damaged.

Further, the downward extensions 27b, 28b have the notches 27d, 28d for limiting the flow of current. This prevents the U, V, and W phases from affecting each other.

The above described embodiment has the following advantages.

(1) In the positive interconnection member 27 and the negative interconnection member 28, the pairs of the downward extensions 27b, 28b serving as extensions extend from the main bodies 27a, 28a to positions closest to the substrate 22 while being parallel to each other. This reduces the parasitic inductance in the interconnection of the capacitors.

(2) The insulation sheet 29 and the gel 36 serving as insulating members are located between the main body 27a of the positive interconnection member 27 and the main body 28a of the negative interconnection member 28 and between the downward extension 27b of the positive interconnection member 27 and the downward extension 28b of the negative interconnection member 28. This configuration is suitable for insulating between the positive interconnection member 27 and the negative interconnection member 28.

(3) The notches 27d, 28d for limiting the flow of current are formed in the downward extensions (extensions) 27b, 28b of the positive interconnection member 27 and the negative interconnection member 28. Limitation of the flow of current suppresses the influence of the flow of current, specifically, influences among the phases.

(4) The widths of the notches 27d, 28d are determined to a value that does not hinder penetration through gel 36. The notches 27d, 28d allow the gel 36 to flow smoothly, so that the gel 36 efficiently reaches required positions.

(5) Of the main body 27a of the positive interconnection member 27 and the main body 28a of the negative interconnection member 28, which are parallel to the substrate 22, the capacitors 17 are mounted on the main body 28a, which is farther from the ceramic substrates 21. Therefore, the capacitors 17 can be integrated with the parts on the substrate 22 including the semiconductor chips 23 serving as switching elements.

(6) The terminal portions 27c, 28c are bonded to the circuit patterns 24b, 24c by ultrasonic bonding, respectively. Thus, compared to joining by soldering, the produced heat is reduced.

(7) Although the distance between the capacitors 17 and the terminal portions 27c, 28c, which are arranged on the negative interconnection member 28 while being electrically insulated from one another, is small, the terminal portions 27c, 28c and the circuit patterns 24b, 24c are joined to each other by ultrasonic bonding, which produces less heat than soldering. Thus, special capacitors with enhanced heat resistance are not required.

A second embodiment of the present invention will now be described with reference to FIGS. 10, 11A, and 11B. The structure of the second embodiment is different from that of the first embodiment in that the thickness of the downward extensions 27b, 28b extending from the main bodies 27a, 28a of the interconnection members 27, 28 to the substrate and the thickness of the terminal portions 27c, 28c are less than the thickness of the main bodies 27a, 28a. Those components that are like or the same as the corresponding components of the first embodiment will not be described.

Figure 10:
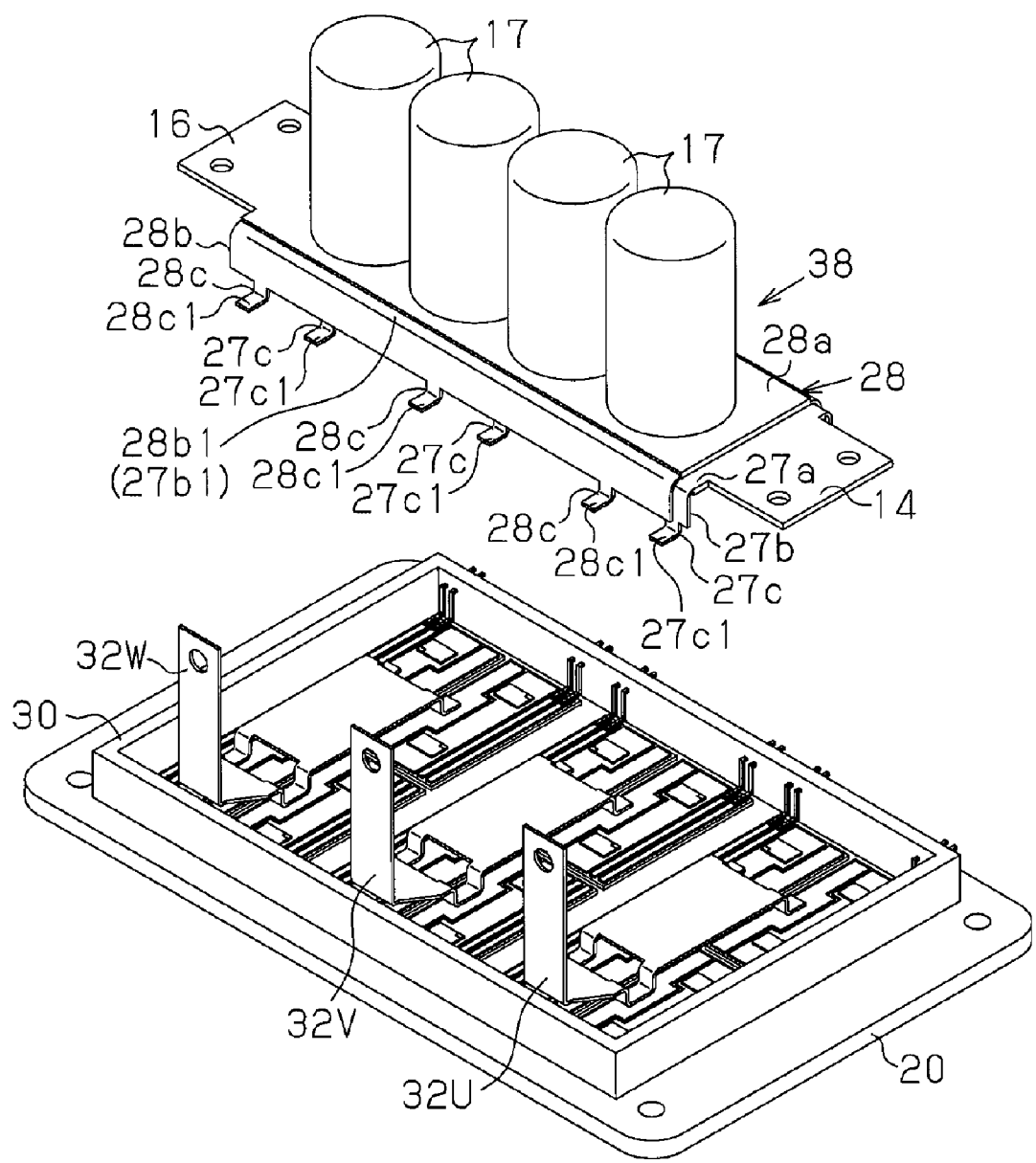
FIG. 10 is a schematic perspective view showing the relationship among the capacitor assembly, the metal base, the support frame, and the output electrode members in an inverter apparatus according to a second embodiment of the present invention.

As in the first embodiment, pairs of downward extensions 27b, 28b are located at ends of the corresponding main body 27a, 28a in the widthwise direction while being bent to extend toward the substrate 22 as shown FIG. 10. Also, terminal portions 27c, 28c each extend downward from the lower ends of the downward extensions 27b, 28b, and then extend parallel with the main bodies 27a, 28a. As shown in FIGS. 11A and 11B, the thickness of the downward extensions 27b, 28b and the thickness of the terminal portions 27c, 28c are less than the thickness of the main bodies 27a, 28a. That is, the downward extensions 27b, 28b include bent portions 27b1, 28b1, which are shaped like angle irons in relation to the main bodies 27a, 28a, respectively. The bent portions 27b1, 28b1 are formed in thin portions of the interconnection members 27, 28. Being shaped like an angle iron refers to a state in which sections on both sides of the bent portion are arranged to be perpendicular to each other. The main bodies 27a, 28a are formed to have a thickness having a necessary capacitance, for example, a thickness of 1 mm. The downward extensions 27b, 28b and the terminal portions 27c, 28c are formed have a thickness that facilitates bending and ultrasonic bonding the terminal portions 27c, 28c, for example, a thickness of 0.5 mm. Although notches 27d, 28d are not illustrated in FIG. 10, a plurality of notches 27d, 28d for limiting the flow of currents may be provided in the downward extensions 27b, 28b as in the first embodiment.

Figure 11A:
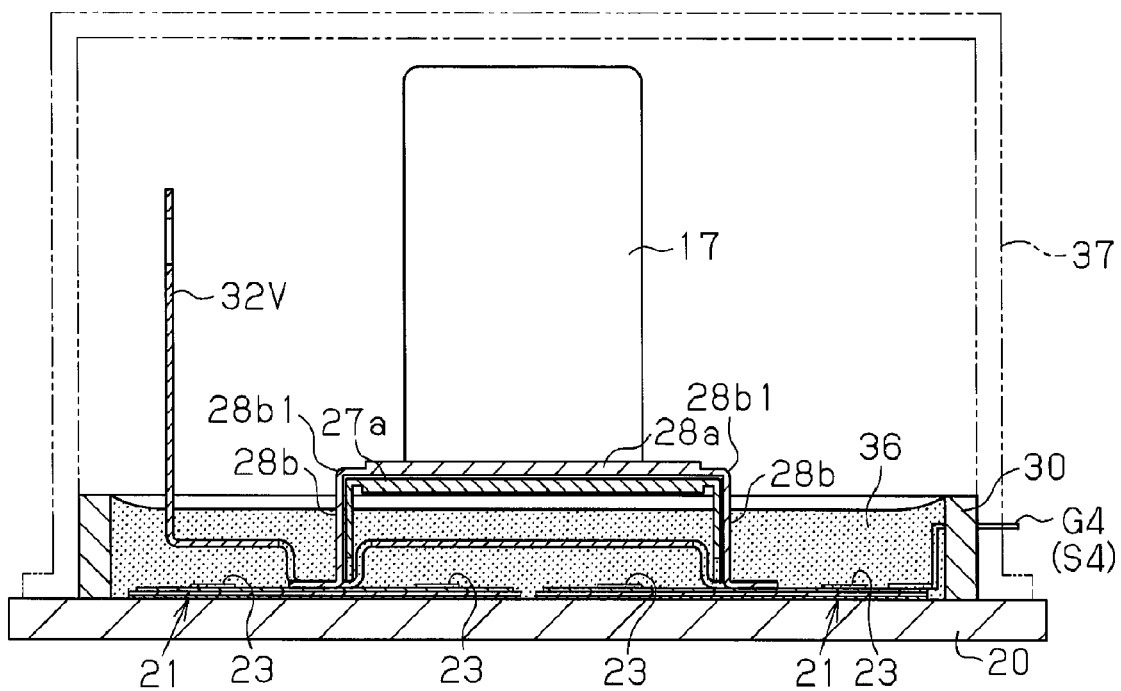
FIG. 11A is a cross-sectional view corresponding to the cross-section taken along line 4A-4A of FIG. 3, showing the inverter apparatus of FIG. 10.
Figure 11B:
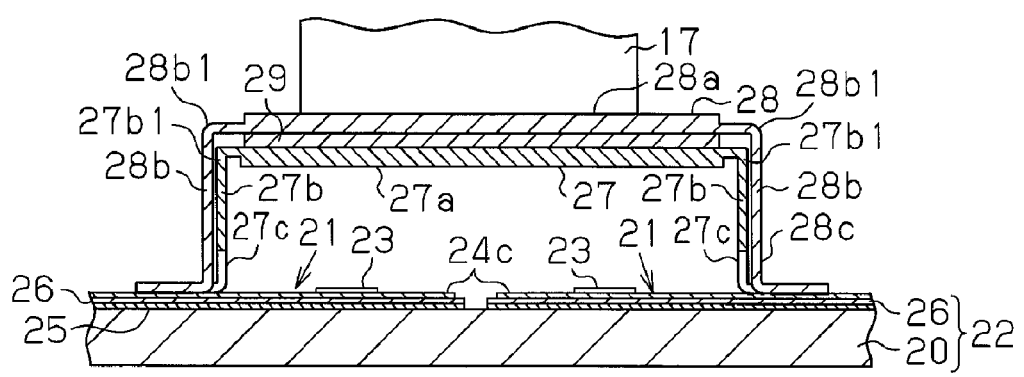
FIG. 11B is a partially enlarged view of FIG. 11A, from which a part is omitted.

As shown in FIG. 11A and FIG. 11B, the positive interconnection member 27 and the negative interconnection member 28 each have a first surface and a second surface. The first surface has a step at a position where the thickness changes. The second surface is opposite to the first surface. The positive interconnection member 27 and the negative interconnection member 28 are arranged such that their second surfaces, that is, the surfaces without steps face each other.

The positive interconnection member 27 and the negative interconnection member 28 are formed by pressing belt-like metal plates to form thick portions and thin portions, and then bending the metal plates to form the downward extensions 27b, 28b and the terminal portions 27c, 28c.

A current the magnitude of which is the sum of currents through the terminal portions 27c, 28c of the main bodies 27a, 28a flows through the main bodies 27a, 28a. The thickness of the positive interconnection member 27 and the negative interconnection member 28 is determined to be a value that allows flow of current without hindrance in response to the load requirement. In a case where the thickness of the downward extensions 27b, 28b and the thickness of the terminal portions 27c, 28c are the same as the thickness of the main bodies 27a, 28a, if the thickness is increased to ensure the required capacitance, the downward extensions 27b, 28b and the terminal portions 27c, 28c are difficult to bend. However, in the present embodiment, since the thickness of the downward extensions 27b, 28b and the thickness of the terminal portions 27c, 28c are determined to values that facilitate bending, the downward extensions 27b, 28b and the terminal portions 27c, 28c are easily bent. The current flowing through the terminal portions 27c, 28c is part of the current flowing through the main body 27a, 28a. That is, the magnitude of the current flowing through the terminal portions 27c, 28c is less than the magnitude of the current flowing through the main body 27a, 28a. Thus, although the thickness of the downward extensions 27b, 28b and the thickness of the terminal portions 27c, 28c are set to values that facilitate bending and terminal portions are made suitable for ultrasonic bonding, a current having a sufficient magnitude is supplied to the semiconductor chips 23 without hindrance.

The present embodiment has the following advantage in addition to the advantages (1) to (7) of the first embodiment.

(8) The downward extensions 27b, 28b include bent portions 27b1, 28b1, which are shaped like angle irons in relation to the main bodies 27a, 28a, respectively. The downward extensions 27b, 28b are formed thinner than the main bodies 27a, 28a. Therefore, even if the thickness of the main body 27a, 28a is set to a sufficient value for ensuring the required capacitance, the downward extensions 27b, 28b and the terminal portions 27c, 28c can be bent easily.

(9) The positive interconnection member 27 and the negative interconnection member 28 are arranged such that their second surfaces (the surfaces without steps) face each other. Therefore, the positive interconnection member 27 and the negative interconnection member 28 can be insulated from each other while being parallel to and close to each other, not only at the main body 27a, 28a, but also at the remaining portions. Thus, compared to a case where the interconnection members 27, 28 are arranged such that a surface without a step and a surface with a step face each other, the interconnection inductance is reduced.

(10) The bent portions 27b1, 28b1 may be formed at the boundary between the thick portion and the thin portion. However, in the present embodiment, the bent portions 27b1, 28b1 are formed in the thick portion. Compared to a case where the bent portions 27b1, 28b1 are formed at the boundary, the downward extensions 27b, 28b are bent easily. Also, since the bent portions 27b1, 28b1 are formed in thin portions, the radius of curvature of the bent portions 27b1, 28b1 can be made small, so that the projection amount of the downward extensions 27b, 28b in the widthwise direction of the main bodies 27a, 28a is reduced. This allows the entire apparatus 11 to be compact.

Figure 12:
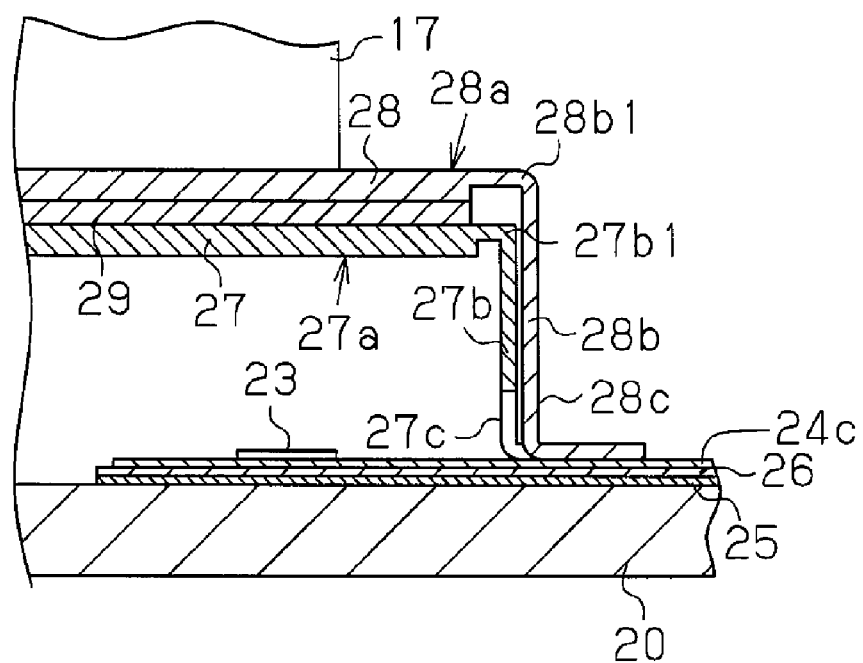
FIG. 12 is a cross-sectional view showing an inverter apparatus, which is a power converter apparatus according to another embodiment.
Figure 13:
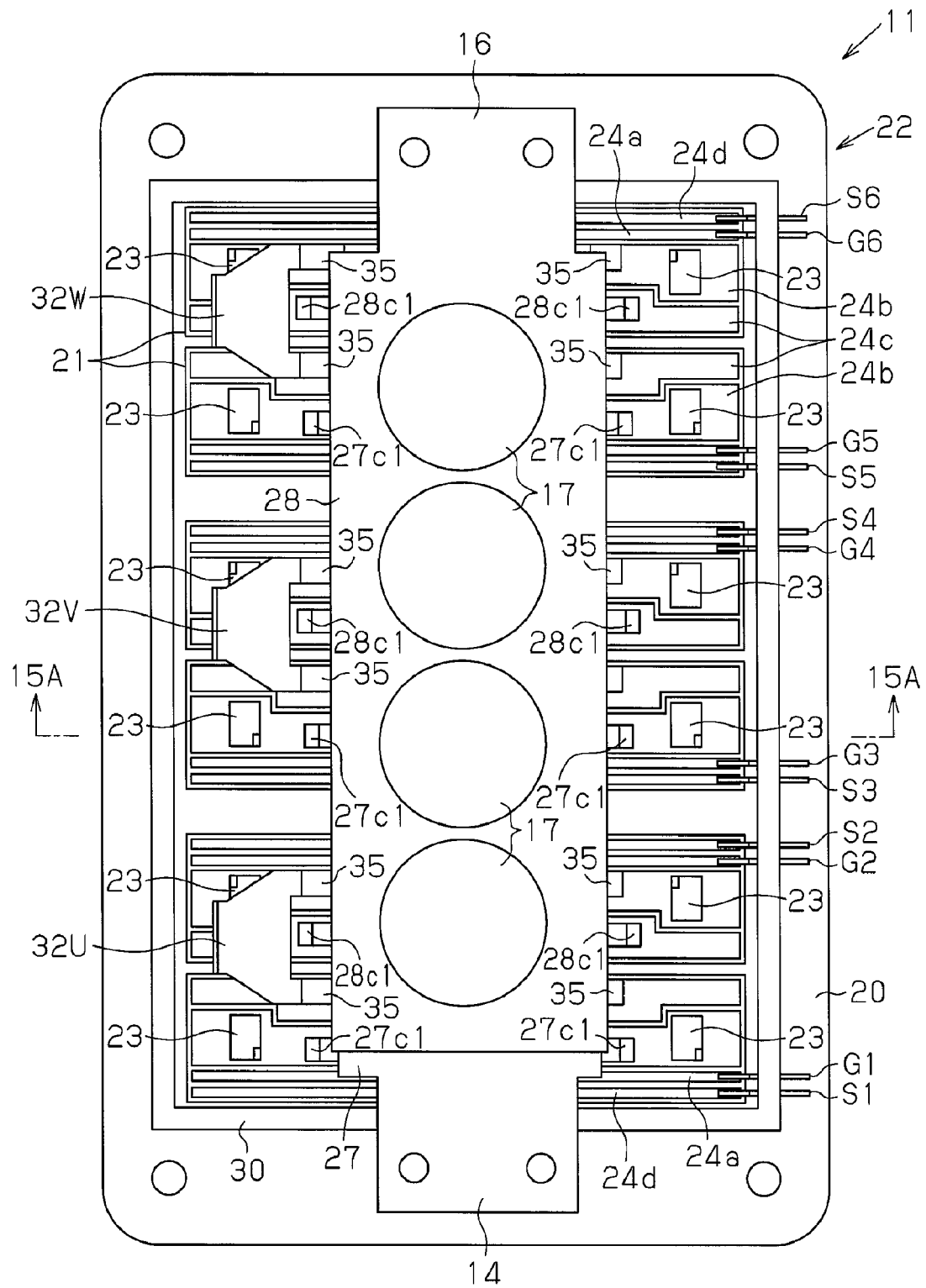
FIG. 13 is a plan view showing an inverter apparatus, which is a power converter apparatus according to a third embodiment of the present invention, from which the cover is omitted.
Figure 14:
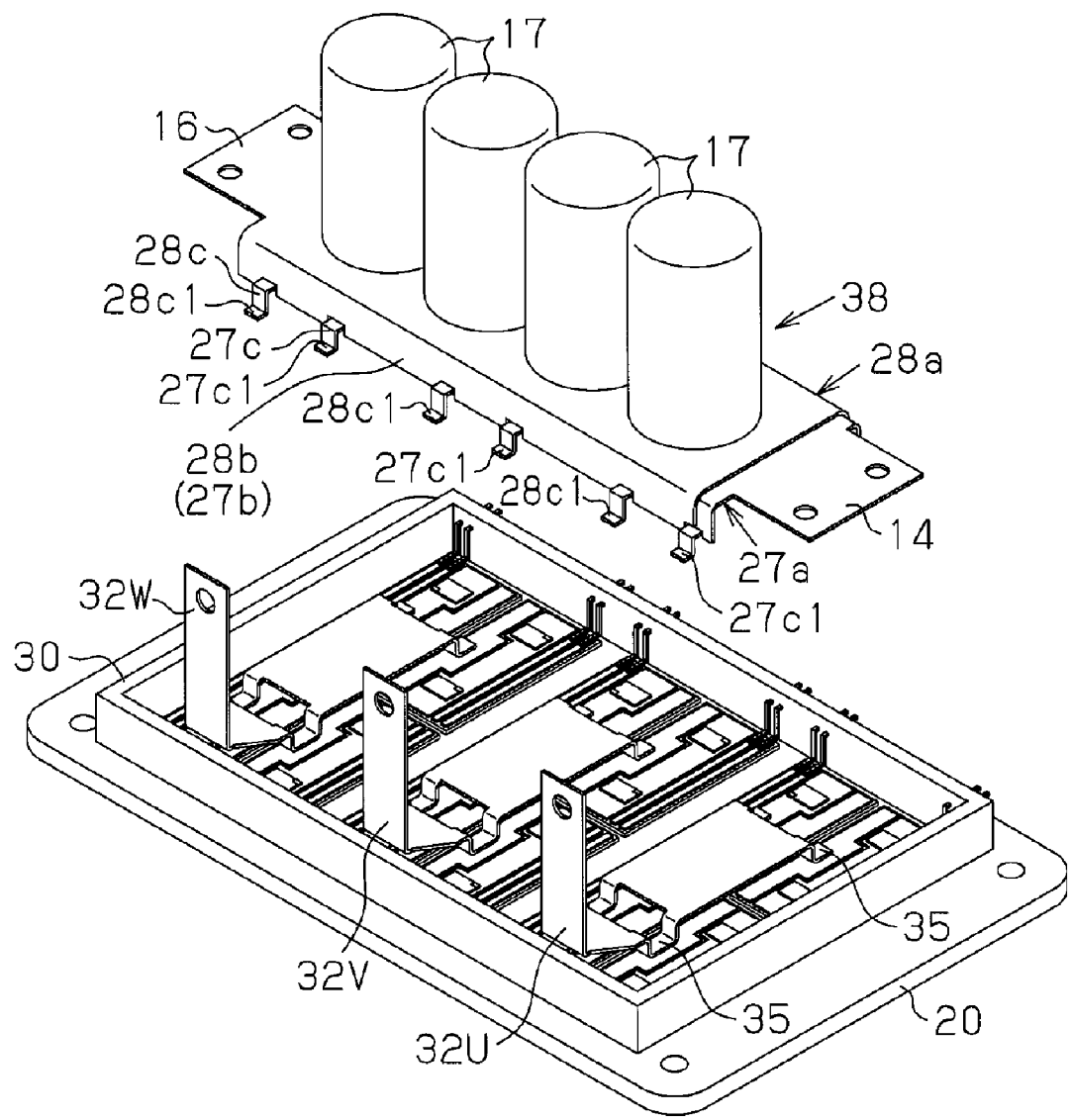
FIG. 14 is a schematic perspective view showing the relationship among the capacitor assembly, the metal base, the support frame, and the output electrode members in the inverter apparatus of FIG. 13.

In the second embodiment, the positive interconnection member 27 and the negative interconnection member 28 arranged such that surfaces without steps face each other. However, as shown in FIG. 12, the interconnection members 27, 28 may be arranged such that a surface with a step and a surface without steps face each other. In a configuration where surfaces without steps face each other, the bending directions of the bent portions 27b1, 28b1 are different in relation to the steps. Thus, two kinds of dies for bending are required, which makes the manufacture troublesome and increases the costs. In contrast, in a configuration where the interconnection members 27, 28 are arranged such that a surface without steps and a surface with a step face each other, the bending direction of the bent portions 27b1, 28b1 is the same in relation to the step. Thus, the manufacture is facilitated compared to the case where the bending direction is different between the bent portions 27b1 and 28b1.

A third embodiment of the present invention will now be described with reference to FIGS. 13 to 15B. The structure of the third embodiment is different from that of the first embodiment in that the terminal portions 27c, 28c are bent such that the cross-sectional shape of the interconnection members 27, 28 is cranked between the main bodies 27a, 28a and the joint portions 27c1, 28c1, and that the joint portions 27c1, 28c1, at which the terminal portions 27c, 28c contact the circuit patterns 24b, 24c, are arranged at positions spaced from the semiconductor chips 23 on the circuit patterns 24b, 24c by equal distances L1, L2. Those components that are like or the same as the corresponding components of the first embodiment will not be described.

Figure 15A:
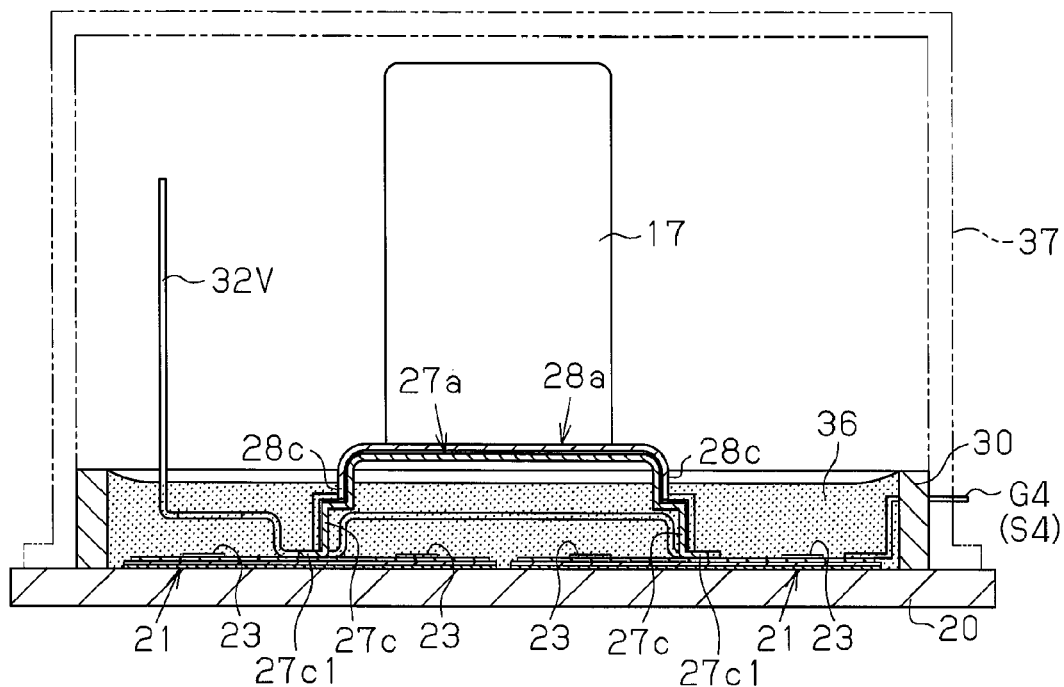
FIG. 15A is a cross-sectional view taken along line 15A-15A in FIG. 13.
Figure 15B:
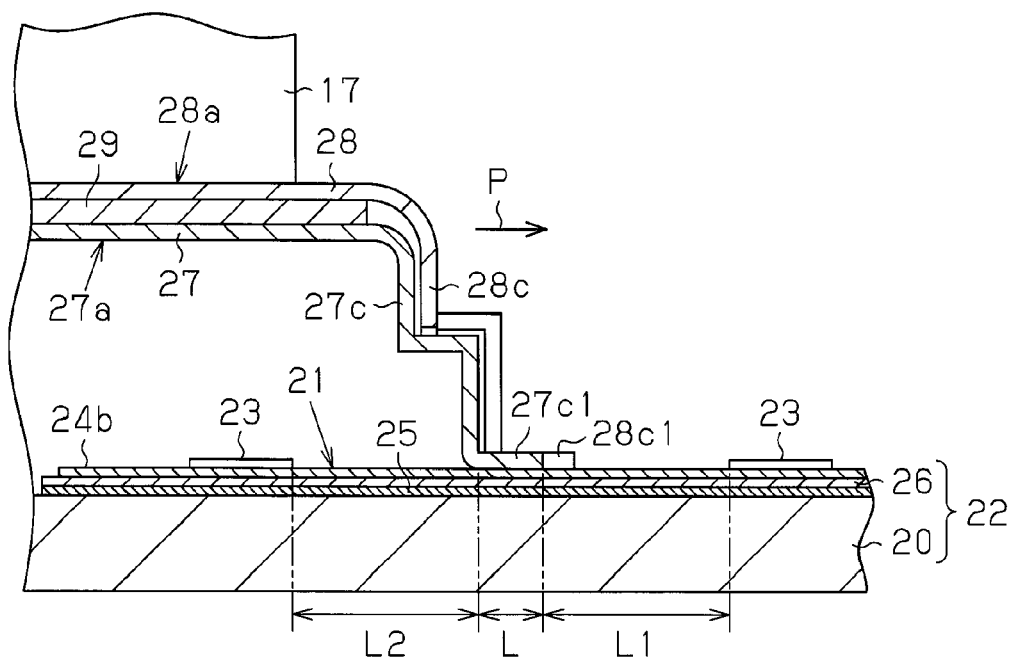
FIG. 15B is a partially enlarged view of FIG. 15A, from which a part is omitted.

As shown in FIGS. 13 to 15B, the terminal portions 27c, 28c are joined to the circuit patterns 24b, 24c at distal ends, that is, at the joint portions 27c1, 28c1 as in the first embodiment. The terminal portions 27c, 28c are bent such that the cross-sectional shape of the interconnection members is cranked between the main bodies and the joint portions. In this description, the cranked shape refers to the shape of a line having two parts that are bent substantially at a right angle. As shown in FIG. 15B, the joint portion 27c1 of each terminal portion 27c is arranged to be spaced from a plurality of (two) semiconductor chips 23 arranged on the corresponding circuit pattern 24b by distances L1, L2. The distances L1, L2 are equal to each other within tolerance. In the terminal portions 27c, 28c, the length of a portion that extends upward from the joint portions 27c1, 28c1 at a right angle is determined such that, when a tool for ultrasonic bonding (horn) presses the joint portions 27c1, 28c1, the tool does not interfere with the terminal portions 27c, 28c. Although notches 27d, 28d are not illustrated in FIG. 14, a plurality of notches 27d, 28d for limiting the flow of currents may be provided in the downward extensions 27b, 28b as in the first embodiment.

The terminal portions 27c, 28c are bent such that the cross-sectional shape of the interconnection members is cranked between the main bodies and the joint portions. Thus, portions other than the joint portions 27c1, 28c1 do not contact the circuit patterns 24b, 24c. Therefore, the distances L1, L2 between each joint portion 27c1 and the corresponding semiconductor chips 23 do not vary, but are equal to each other.

When a force of the direction represented by arrow P in FIG. 15B acts on the terminal portions 27c, 28c, the force is absorbed by elastic deformation of the cranked terminal portions 27c, 28c having two bent portions before reaching the joint portions 27c1, 28c1. Thus, stress acting on the joint portions 27c1, 28c1 is reduced.

Also, the cranked terminal portions 27c, 28c allow a tool for ultrasonic bonding to reliably join only the joint portions 27c1, 28c1 along the entire length L by ultrasonic bonding to the corresponding circuit patterns 24b, 24c, without interfering with the terminal portions 27c, 28c. This improves the mechanical and electrical stability of the apparatus.

The present embodiment has the following advantage in addition to the advantages (1) to (7) of the first embodiment.

(11) The terminal portions 27c, 28c are bent such that the cross-sectional shape of the interconnection members is cranked between the main bodies and the joint portions, and the joint portion 27c1 of the terminal portion 27c is joined to the circuit pattern 24b at a position spaced from the semiconductor chips 23 by the same distance. Therefore, the interconnection inductance is stably equalized, the imbalance of currents supplied to the semiconductor chips 23 is reduced.

Further, since the terminal portions 27c, 28c are bent such that the cross-sectional shape of the interconnection members is cranked between the main bodies and the joint portions, the stress at the joint portions 27c1, 28c1 is reduced.

The present invention is not limited to the embodiments described above, but may be embodied as follows, for example.

In place of the insulation sheet 29, a plate-like insulator (for example, a resin plate) may be used. Further, the positive interconnection member 27 and the negative interconnection member 28 may be entirely insulated by gel.

The positive interconnection member 27 and the negative interconnection member 28 may be joined to the ceramic substrates 21 by method other than ultrasonic bonding, for example, laser welding or soldering. Likewise, the joining of the output electrode members 32U, 32V, 32W to the ceramic substrates 21, or the joining the drive input terminals G1 to G6 and the signal terminals S1 to S6 to the ceramic substrates 21 may be achieved by laser welding or soldering.

The arrangement of the main bodies 27a, 28a may be changed as long as the main bodies 27a, 28a are parallel with the substrate 22, close to each other, and insulated from each other. For example, instead of arranging the main body 28a on the upper side, or at a position farther from the substrate 22, the main body 27a may be arranged on the upper side. However, when electrolytic capacitors are used as the capacitors 17, the main body 28a of the negative interconnection member is preferably located at the top since an outer portion of each electrolytic capacitor, where a shielding material is located, is grounded.

Figure 16:
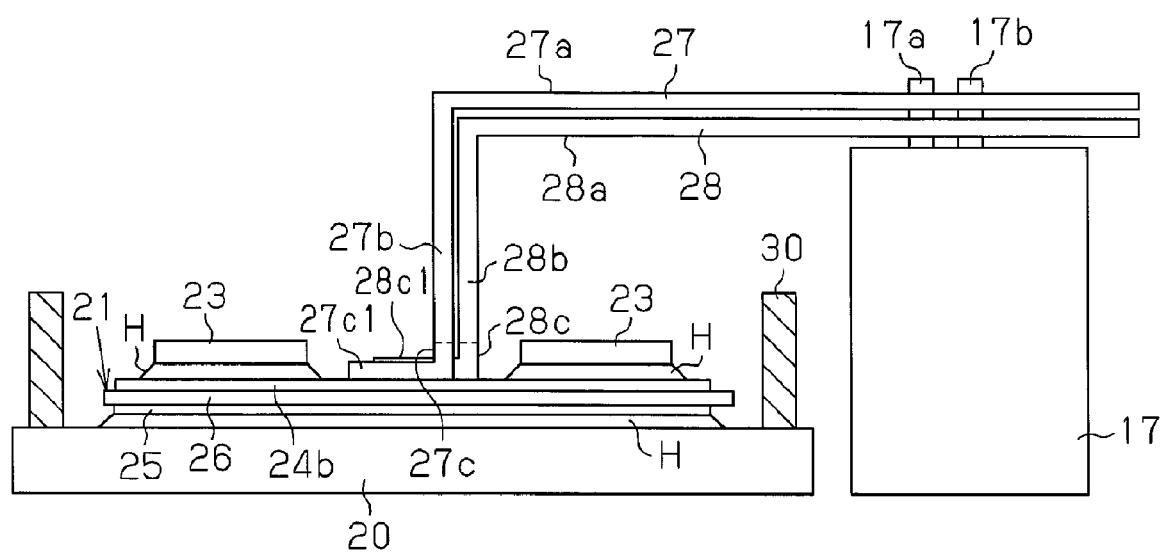
FIG. 16 is a cross-sectional view showing an inverter apparatus, which is a power converter apparatus according to another embodiment.
Figure 17A:
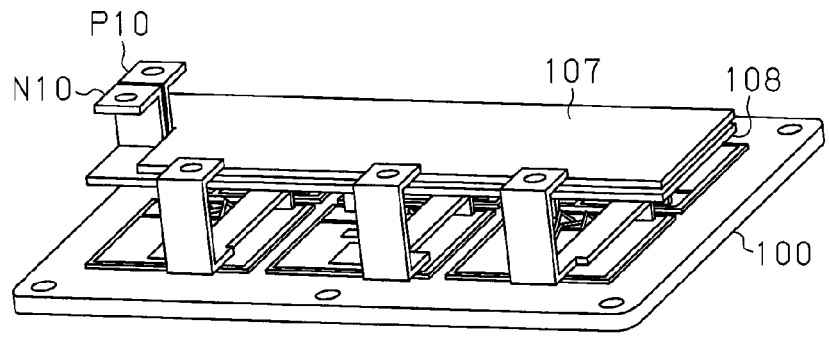
FIG. 17A is a perspective view illustrating a prior art power converter apparatus.
Figure 17B:
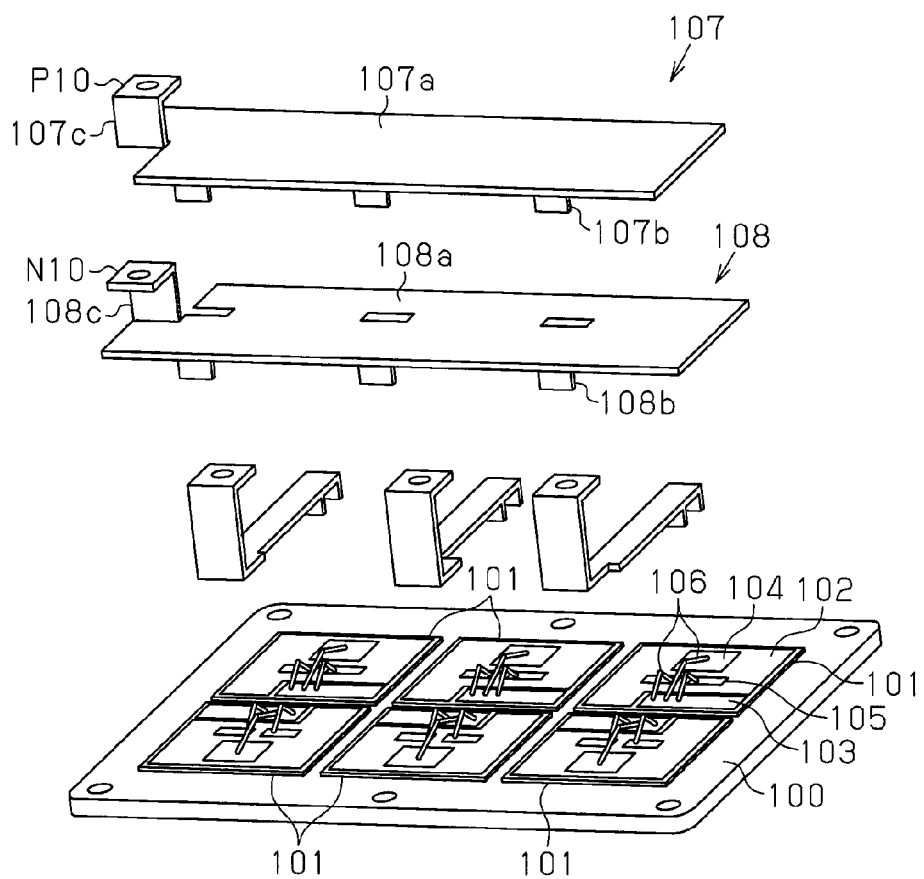
FIG. 17B is an exploded perspective view showing the power converter apparatus of FIG. 17A.

The positions of the capacitors 17 are not limited to positions facing the substrate 22, that is, positions above the metal base 20. For example, capacitors 17 may be located on the side of the metal base 20. In this case, the main body 28a of the negative interconnection member 28 is located closer to the capacitors 17, that is, on the lower side. The downward extensions 27b, 28b extend downward from the main bodies 27a, 28a, respectively. The lower ends of the downward extensions 27b, 28b are bent to form the terminal portions 27c, 28c. The terminal portions 27c, 28c are joined at the joint portions 27c1, 28c1 to the circuit patterns 24b, 24c for drain and source on the ceramic substrates 21. In this embodiment, each arm is configured by two semiconductor chips 23 mounted on one ceramic substrate 21, and six rows of ceramic substrates 21 are arranged along the direction perpendicular to the plane of FIG. 16. In FIG. 16, the substrate elements other than the circuit pattern 24b or the output electrode member 32U are not illustrated. In this case also, in the positive interconnection member 27 and the negative interconnection member 28, the downward extensions 27b, 28b serving as extensions extend from the main bodies 27a, 28a toward the ceramic substrates 21 and to positions closest to the substrate 21 while being parallel to each other. This reduces the parasitic inductance in the interconnection of the capacitors. Further, the downward extensions 27b, 28b have the notches 27d, 28d for limiting the flow of current. This suppresses the influence of the flow of current, specifically, influences among the phases. In FIG. 16, solder H for joining the ceramic substrate 21 to the metal base 20 and solder H for joining the semiconductor chips 23 to the circuit pattern 24b are shown.

Instead of forming each arm by two ceramic substrates 21, each arm may be formed by one ceramic substrate 21. This structure eliminates the necessity of the wire bonding to electrically connect the gate signal circuit patterns 24a to each other and the source signal circuit patterns 24d to each other. Also, the number of joints between each drain circuit pattern 24b and the corresponding terminal portions 27c and the number of joints between each source circuit pattern 24c and the corresponding terminal portions 28c may be reduced from two to one. Further, the number of joints between each joint portion 35 and the corresponding one of the drain circuit pattern 24b and the source circuit pattern 24c may be reduced from two to one.

To reduce the number of the ceramic substrates 21, each arm may be formed by one ceramic substrate 21. Alternatively, two or more arms may be provided on one ceramic substrate 21.

The metal base 20 may be formed of aluminum-based metal, and the ceramic substrates 21 may be DBA (Direct Brazed Aluminum) substrates, which has an aluminum layer on each side. In this case, the circuit patterns 24a to 24d may be formed on the upper surface of the DBA substrate, and the lower surface of the DBA substrate may be brazed to the metal base with aluminum-based brazing filler metal.

In place of the ceramic substrates 21, metal substrates with insulation layer on the surface may be used as insulated substrates. In this case, the circuit patterns 24a to 24d may be formed on the insulation layer.

Instead of joining insulated substrates to the metal base 20 by soldering or brazing, an insulation layer may be formed on the metal base 20, and the circuit patterns 24a to 24d may be formed on the insulation layer. In this case, the number of components is reduced, and the step for joining the insulated substrates to the metal base 20 is unnecessary.

The number of the capacitors 17 is not limited to four, but may be changed to less or more than four depending on the capacitance of the rated current value of the inverter apparatus 11 and the capacitance of the capacitors.

The capacitors 17 are not limited to electrolytic capacitors, but may be, for example, electric double-layer capacitors.

The switching elements Q, Q1 to Q6 are not limited to MOSFETs, but may be other types of power transistors, such as IGBTs (Insulated-Gate Bipolar Transistors), or thyristors.

The number of pairs of the switching elements Q and the diode D in each arm is not limited to four, but may be less or more than four depending on the amount current through the arm. Alternatively, each arm may be formed by a single switching element Q and a single diode D.

The single pair of the switching element and the diode does not need to be packaged as one semiconductor chip 23, but may be independently mounted on the circuit.

Instead of three-phase AC, the inverter apparatus 11 may output single phase AC. In such a case, two pairs of upper arms and lower arms are provided.

The power converter apparatus does not need to be the inverter apparatus 11, but may be a DC-DC converter.

The juncture between the positive terminal 17a of the capacitor 17 and the positive interconnection member 27 the juncture between the negative terminal 17b and the negative interconnection member 28 are not limited to fastening by screws, but may be achieved by a joining method in which the capacitors 17 are less affected by heat than in soldering. For example, precision resistance welding or laser beam welding may be employed.

In the third embodiment, the distances L1, L2 between the joint portion 27c1 of the terminal portion 27c and the semiconductor chips 23 are equal to each other within tolerance. However, the terminal portion 27c may be joined to the circuit pattern 24b in such a manner that the impedances of the paths of electric current from the terminal portion 27c to the semiconductor chips 23 are equal to each other within tolerance.

As long as the power converter apparatus is configured such that a plurality of switching elements are connected in parallel and plate-like conductors are used as interconnection members, the capacitors 17 may be omitted.

What is claimed:

1. A power converter apparatus comprising:
   a substrate on which switching elements are mounted;
   a positive terminal interconnection member and a negative terminal interconnection member placed on the substrate, wherein the interconnection members each have a plate-like main body that is located above and parallel to the substrate, and wherein the main bodies of the interconnection members are stacked to be close to each other while being electrically insulated from each other; and
   a capacitor having a positive terminal connected to the main body of the positive terminal interconnection member and a negative terminal connected to the main body of the negative terminal interconnection member,
   wherein each of the positive terminal interconnection member and the negative terminal interconnection member further includes a plate-like extension that extends from the corresponding main body toward the substrate, and a terminal portion that extends from the extension and is joined to the substrate, the extensions extending to positions closest to the substrate while being parallel to and close to each other.

2. The power converter apparatus according to claim 1, wherein an insulation member is provided between the main bodies of the interconnection members, and between the extensions of the interconnection members.

3. The power converter apparatus according to claim 1, wherein a notch for limiting the flow of current is formed in each of the extensions.

4. The power converter apparatus according to claim 3, wherein the width of the notch is determined to be a value that does not hinder the passage of gel for insulation or protection.

5. The power converter apparatus according to claim 1, wherein, of the main bodies of the two interconnection members, the capacitor is mounted on the main body that is farther from the substrate.

6. The power converter apparatus according to claim 1, wherein each extension includes a bent portion, which is shaped like an angle iron in relation to the corresponding main body, and wherein the thickness of the extensions and the thickness of the terminal portions are less than the thickness of the main bodies.

7. The power converter apparatus according to claim 6, wherein each interconnection member includes a first surface having a step at a section where the thickness changes, and a second surface on the opposite side to the first surface, wherein the interconnection members are arranged such that the second surfaces face each other.

8. The power converter apparatus according to claim 6, wherein each interconnection member includes a first surface having a step at a section where the thickness changes, and a second surface on the opposite side to the first surface, wherein the interconnection members are arranged such that a first surface and a second surface face each other.

9. The power converter apparatus according to claim 6, wherein each bent portion is formed in a thin section of the corresponding interconnection member.

10. The power converter apparatus according to claim 1, wherein the substrate has a circuit pattern on which a plurality of semiconductor chips including the switching elements are mounted, and wherein each terminal portion has at its distal end a joint portion that is joined to the circuit pattern,
    wherein the terminal portions are bent such that the cross-sectional shape of each interconnection member is cranked between the main body and the joint portion, and
    wherein each joint portion is joined to the circuit pattern, so as to be spaced from the semiconductor chips by equal distances.

11. The power converter apparatus according to claim 1, wherein the terminal portions are joined to the substrate by ultrasonic bonding.

* * * * *